United States Patent
Chiba et al.

(10) Patent No.: US 12,207,480 B2
(45) Date of Patent: Jan. 21, 2025

(54) VARIABLE RESISTANCE NON-VOLATILE MEMORY WITH A GATE INSULATOR FILM AT A SAME HEIGHT AS A VOLTAGE APPLICATION ELECTRODE

(71) Applicant: KIOXIA CORPORATION, Tokyo (JP)

(72) Inventors: Tomoki Chiba, Fujisawa Kanagawa (JP); Daisaburo Takashima, Yokohama Kanagawa (JP); Hidehiro Shiga, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 240 days.

(21) Appl. No.: 17/899,898

(22) Filed: Aug. 31, 2022

(65) Prior Publication Data

US 2023/0284460 A1 Sep. 7, 2023

(30) Foreign Application Priority Data

Mar. 2, 2022 (JP) .................................. 2022-031640

(51) Int. Cl.
*H10B 63/00* (2023.01)
*G11C 11/16* (2006.01)
(Continued)

(52) U.S. Cl.
CPC .......... *H10B 63/34* (2023.02); *G11C 11/1673* (2013.01); *G11C 13/0026* (2013.01);
(Continued)

(58) Field of Classification Search
CPC ...... H10B 63/34; H10B 61/22; H10B 63/845; H10B 63/10; G11C 11/1673; G11C 13/0026; G11C 13/004; G11C 2213/71; G11C 13/0007; G11C 11/1659; G11C 13/003; G11C 13/0033; G11C 2213/79;
(Continued)

(56) References Cited

U.S. PATENT DOCUMENTS

| | | | |
|---|---|---|---|
| 8,436,331 B2 | 5/2013 | Iwakaji et al. | |
| 9,343,672 B2 | 5/2016 | Park et al. | |

(Continued)

FOREIGN PATENT DOCUMENTS

| | | |
|---|---|---|
| JP | 2021-002629 A | 1/2021 |
| TW | I556432 B | 11/2016 |

*Primary Examiner* — Jerome Leboeuf
(74) *Attorney, Agent, or Firm* — Kim & Stewart LLP

(57) ABSTRACT

A variable resistance non-volatile memory includes a semiconductor substrate, a first electrode line extending in a first direction away from the semiconductor substrate, a second electrode line extending in the first direction parallel to the first electrode line, an insulating film between the first and second electrode lines, a variable resistance film formed on the first electrode line, a low electrical resistance layer formed on the variable resistance film and having a lower electrical resistance than the variable resistance film, a semiconductor film in contact with the low electrical resistance layer and the insulating film, and formed on opposite surfaces of the second electrode line, a gate insulator film extending in the first direction and in contact with the semiconductor film, and a voltage application electrode that extends in a second direction that crosses the first direction, and is in contact with the gate insulator film.

16 Claims, 27 Drawing Sheets

(51) Int. Cl.
  *G11C 13/00* (2006.01)
  *H10B 61/00* (2023.01)
  *H10N 70/00* (2023.01)
  *H10N 70/20* (2023.01)
(52) U.S. Cl.
  CPC ............ *G11C 13/004* (2013.01); *H10B 61/22* (2023.02); *H10B 63/845* (2023.02); *H10N 70/231* (2023.02); *H10N 70/8413* (2023.02); *H10N 70/8825* (2023.02); *H10N 70/8828* (2023.02); *H10N 70/8833* (2023.02); *G11C 2213/71* (2013.01)
(58) Field of Classification Search
  CPC ............. G11C 13/0004; H10N 70/231; H10N 70/8413; H10N 70/8825; H10N 70/8828; H10N 70/8833; H10N 70/8616; H10N 70/881
  See application file for complete search history.

(56) References Cited

U.S. PATENT DOCUMENTS

| | | |
|---|---|---|
| 9,450,026 B2 | 9/2016 | Tajima et al. |
| 2015/0270312 A1 | 9/2015 | Tajima et al. |
| 2017/0098763 A1* | 4/2017 | Tajima ............... H10N 70/8833 |
| 2019/0333928 A1* | 10/2019 | Nagashima ............. G11C 11/40 |
| 2019/0333967 A1* | 10/2019 | Park ....................... H10B 63/34 |
| 2020/0403035 A1 | 12/2020 | Ogiwara et al. |
| 2021/0280779 A1* | 9/2021 | Boivin ................. H10N 70/061 |

\* cited by examiner

VARIABLE RESISTANCE NON-VOLATILE MEMORY WITH A GATE INSULATOR FILM AT A SAME HEIGHT AS A VOLTAGE APPLICATION ELECTRODE

CROSS-REFERENCE TO RELATED APPLICATION(S)

This application is based upon and claims the benefit of priority from Japanese Patent Application No. 2022-031640, filed Mar. 2, 2022, the entire contents of which are incorporated herein by reference.

FIELD

Embodiments described herein relate generally to a variable resistance non-volatile memory.

BACKGROUND

A variable resistance non-volatile memory is proposed in which variable resistance storage elements such as a resistive random-access memory (ReRAM) element, an alloy type phase change memory (PCM) element, and an interfacial phase change memory (iPCM) element are integrated on a semiconductor substrate. In the variable resistance non-volatile memory, the variable resistance storage element is put into a high resistance state or a low resistance state by passing a current through the variable resistance storage element.

DESCRIPTION OF THE DRAWINGS

FIGS. 6A to 6C are cross-sectional views in an XY plane direction showing the cell block of the variable resistance non-volatile memory according to the first embodiment, in which FIG. 6A is a cross-sectional view taken along line A-A' in FIG. 5, FIG. 6B is a cross-sectional view taken along line B-B' in FIG. 5, and FIG. 6C is a cross-sectional view taken along line C-C' in FIG. 5.

DETAILED DESCRIPTION

Figure 1:
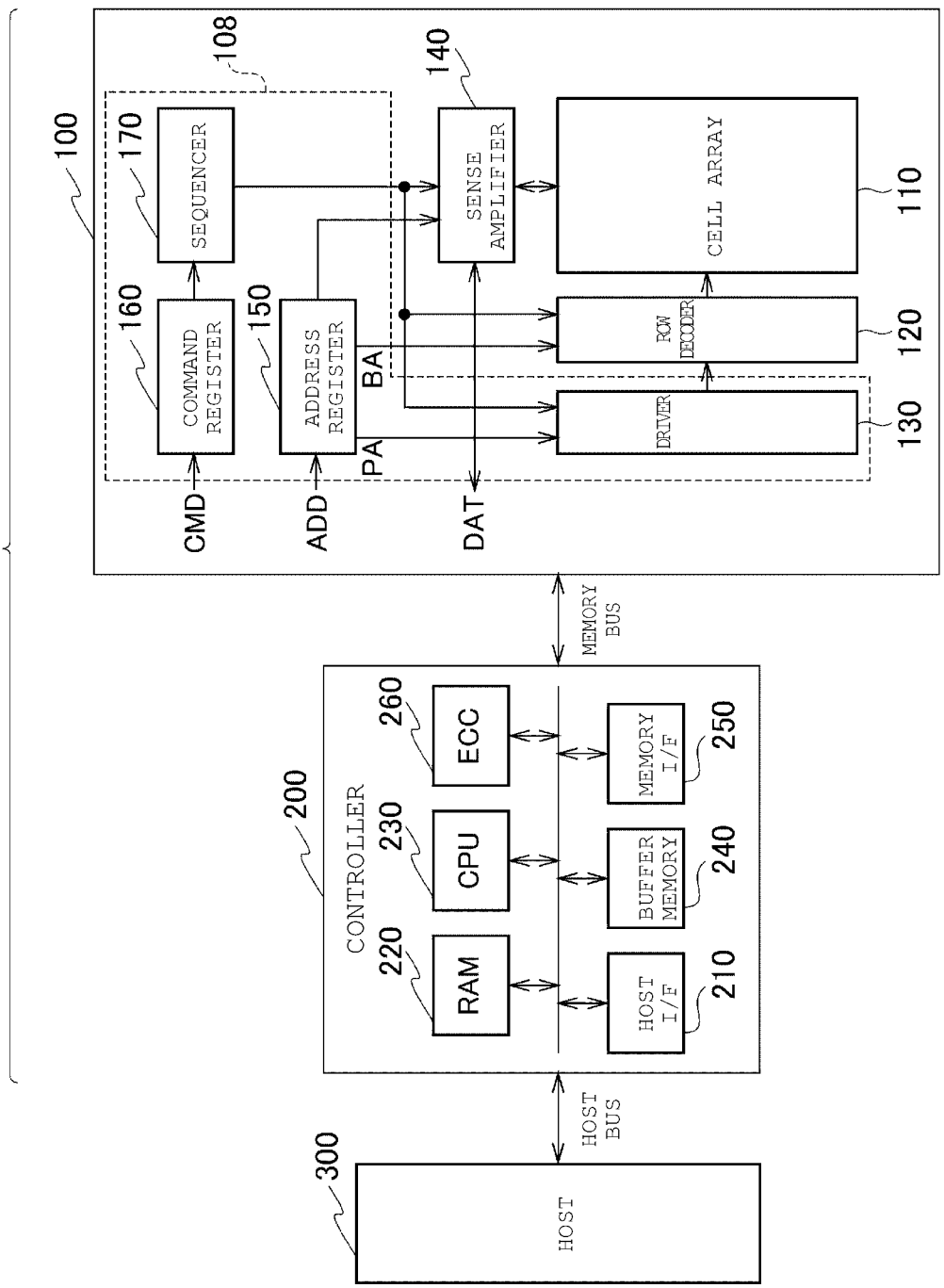
FIG. 1 is a block diagram of a memory system to which a variable resistance non-volatile memory according to a first embodiment is applied.

Embodiments provide a variable resistance non-volatile memory capable of optimizing a current flowing through the variable resistance storage element.

In general, according to one embodiment, a variable resistance non-volatile memory includes a semiconductor substrate, a first electrode line extending in a first direction away from the semiconductor substrate, a second electrode line extending in the first direction parallel to the first electrode line, an insulating film between the first electrode line and the second electrode line, a variable resistance film formed on an outer periphery of the first electrode line, a low electrical resistance layer formed on an outer periphery of the variable resistance film and having a lower electrical resistance than the variable resistance film, a semiconductor film in contact with an outer periphery of the low electrical resistance layer and the insulating film, and formed on opposite surfaces of the second electrode line, a gate insulator film extending in the first direction and in contact with an outer periphery of the semiconductor film, and a voltage application electrode that extends in a second direction that crosses the first direction, and is in contact with an outer periphery of the gate insulator film.

Hereinafter, embodiments will be described with reference to the drawings. In the following description, components having the same function and configuration are designated by a common reference numeral. In the following description, a plurality of cell blocks CB0 to CB(n−1) may also be simply referred to as a cell block CB. Further, a variable resistance element RE may also be displayed as a variable resistance film RE.

First Embodiment

Memory System

The block configuration of a memory system 1 to which a variable resistance non-volatile memory 100 according to the first embodiment is applied will be described. As shown in FIG. 1, the memory system 1 includes the variable resistance non-volatile memory 100 and a controller 200. The variable resistance non-volatile memory 100 and the controller 200 may be combined to form one semiconductor device, and an example of the semiconductor device includes a memory card and a solid-state drive (SSD).

The variable resistance non-volatile memory 100 includes a plurality of memory cells and stores data in a non-volatile manner. The controller 200 is coupled to the variable resistance non-volatile memory 100 by a memory bus, and is coupled to the host 300 by a host bus. The controller 200 controls the variable resistance non-volatile memory 100, and accesses the variable resistance non-volatile memory 100 in response to a host command received from the host 300. The host 300 is, for example, a digital camera, a personal computer, and the like, and the host bus is, for example, a bus configured according to a memory interface standard. The memory bus communicates signals according to the memory interface standard.

Configuration of Controller 200

As shown in FIG. 1, the controller 200 includes a host interface (host I/F) circuit 210, a built-in memory (random access memory (RAM)) 220, a processor (central processing unit (CPU)) 230, a buffer memory 240, a memory interface (host I/F) circuit 250, and an error checking and correcting (ECC) circuit 260.

The host interface circuit 210 is coupled to the host 300 via the host bus, and transfers each of the host command and data received from the host 300 to the processor 230 and the buffer memory 240. Further, the host interface circuit 210 transfers the data in the buffer memory 240 to the host 300 in response to the instruction of the processor 230.

The processor 230 controls the operation of the entire controller 200. For example, when the processor 230 receives a host command related to reading from the host 300, the processor 230 causes the memory interface circuit 250 to issue a read command to the variable resistance non-volatile memory 100 in response to the host command. The processor 230 performs the same operation when a host command related to writing from the host 300 is received. Further, the processor 230 executes various processing to manage the variable resistance non-volatile memory 100.

The memory interface circuit 250 is coupled to the variable resistance non-volatile memory 100 via the memory bus, and manages communication with the variable resistance non-volatile memory 100. Then, the memory interface circuit 250 transmits various signals to the variable resistance non-volatile memory 100 based on the instruction received from the processor 230, and also receives various signals from the variable resistance non-volatile memory 100.

The buffer memory 240 temporarily stores write data to the variable resistance non-volatile memory 100 and read data from the variable resistance non-volatile memory 100.

The built-in memory 220 is, for example, a semiconductor memory such as a dynamic random-access memory (DRAM) or a static random-access memory (SRAM), and is used as a work area of the processor 230. The built-in memory 220 stores a firmware to manage the variable resistance non-volatile memory 100, and various management tables such as a shift table, a history table, and a flag table.

The error correcting code (ECC) circuit 260 performs error detection and error correction processing related to data stored in the variable resistance non-volatile memory 100. That is, the ECC circuit 260 generates an error correction code at the time of the write of data, adds the error correction code to the write data, and decodes the error correction code when reading the data.

Configuration of Variable Resistance Non-Volatile Memory 100

As shown in FIG. 1, the variable resistance non-volatile memory 100 includes a cell array 110, a row decoder 120, a driver circuit 130, a sense amplifier 140, an address register 150, a command register 160, and a sequencer 170. A peripheral circuit 108 includes the driver circuit 130, the address register 150, the command register 160, and the sequencer 170.

The cell array 110 includes a plurality of blocks including a plurality of non-volatile memory cells associated with rows (which correspond to word lines) and columns (which correspond to bit lines). The cell array 110 stores data given by the controller 200.

The row decoder 120 selects one of the blocks in the cell array 110 based on a block address BA in the address register 150, and further selects the word line direction in the selected block.

The driver circuit 130 supplies a voltage to the selected block via the row decoder 120 based on a page address PA in the address register 150.

The sense amplifier 140 includes a sense amplifier module provided for each bit line BL, senses the data read from the cell array 110 and when reading data, and performs necessary operations. Then, data DAT is output to the controller 200. At the time of the write of data, the write data DAT received from the controller 200 is transferred to the cell array 110. The address register 150 stores an address ADD received from the controller 200. The address ADD includes the block address BA and the page address PA.

The command register 160 stores a command CMD received from the controller 200.

The sequencer 170 controls the operation of the entire variable resistance non-volatile memory 100 based on the command CMD stored in the command register 160.

Circuit Configuration of Cell Array 110

Figure 2:
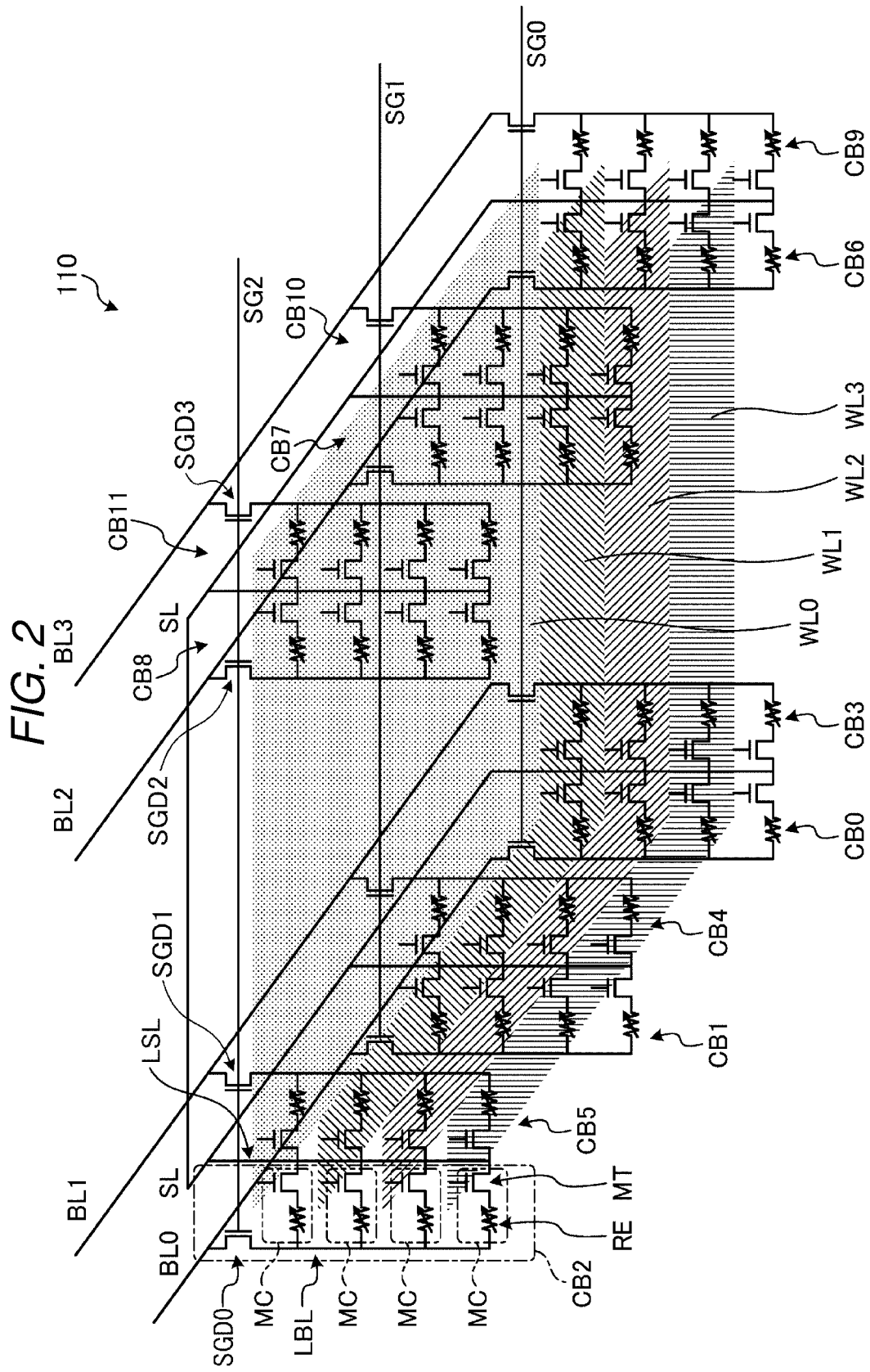
FIG. 2 is an equivalent circuit diagram of a cell array of the variable resistance non-volatile memory according to the first embodiment.

FIG. 2 is an equivalent circuit diagram of the cell array 110 of the variable resistance non-volatile memory 100 according to the first embodiment.

As shown in FIG. 2, the cell array 110 includes a ladder coupling type memory configuration. In the ladder coupling type memory configuration, the plurality of cell blocks CB0 to CB(n−1) (where n is an integer of 1 or higher) which are two-dimensionally arranged make up the cell array 110. The cell block CB includes a plurality of memory cells MC that are connected in parallel in a ladder shape between the local bit line LBL and the local source line LSL. Each memory cell MC includes the variable resistance element RE and a cell transistor MT which are connected in series.

The memory cell MC includes the variable resistance element RE and the cell transistor MT. An example of the variable resistance element RE is an alloy type phase transition element ($Ge_2Sb_2Te_5$). The variable resistance element RE enters a low resistance or high resistance state when its crystal state changes. In the following, the change in the crystal state of the variable resistance element RE is referred to as "phase change", a case where the variable resistance element RE is in the low resistance state (LRS) is described as a "set state", and a case where the variable resistance element RE is in the high resistance state (HRS) is described as a "reset state". For example, when the crystal state changes to an amorphous state, the variable resistance element RE enters the high resistance state. When the variable resistance element RE crystallizes, its crystal state changes and the variable resistance element RE enters the low resistance state. When the selected memory cell MC is in the high resistance state (reset state), the voltage of the bit line BL drops slowly, and when the selected memory cell MC is in the low resistance state (set state), the voltage of the bit line BL drops rapidly. Further, the cell transistor MT includes a semiconductor film, a gate insulating film, and a gate electrode. In the memory cell MC, the variable resistance element RE and the cell transistor MT are connected in series.

The local bit line LBL is connected to the bit lines BL0 to BL3 via select transistors SGD0 to SGD3. The local source line LSL is connected to the source line SL. Further, the number of the memory cells MC in each of the cell blocks CB may be 8, 32, 48, 64, 96, 128, and the like, and the number is not limited.

During the access operation to the variable resistance element RE, the select transistor SGD of the selected cell block CB is turned on, and the select transistor SGD of the non-selected cell block CB remains off. In the selected cell block CB, the cell transistor MT of the selected memory cell MC is turned on, and the cell transistor MT of the non-selected memory cell MC remains off. When a voltage is applied to the bit line BL and the source line SL, a cell current flows through the path of the bit line BL→the local bit line LBL→the variable resistance element RE of the selected memory cell MC→the cell transistor MT of the selected memory cell MC→the local source line LSL→the source line SL.

That is, in the ladder coupling type memory, a plurality of cell transistors MT are connected in parallel between the bit line BL and the source line SL in the cell block CB, and therefore it is possible to shorten the current path during the access operation to the variable resistance element RE. As a result, the cell current amount can be secured to an extent enough to enable a write operation (Set and Reset operation) and a read operation (detection of Set and Reset state) of the variable resistance element RE.

Perspective View Configuration of Cell Array 110

Figure 3:
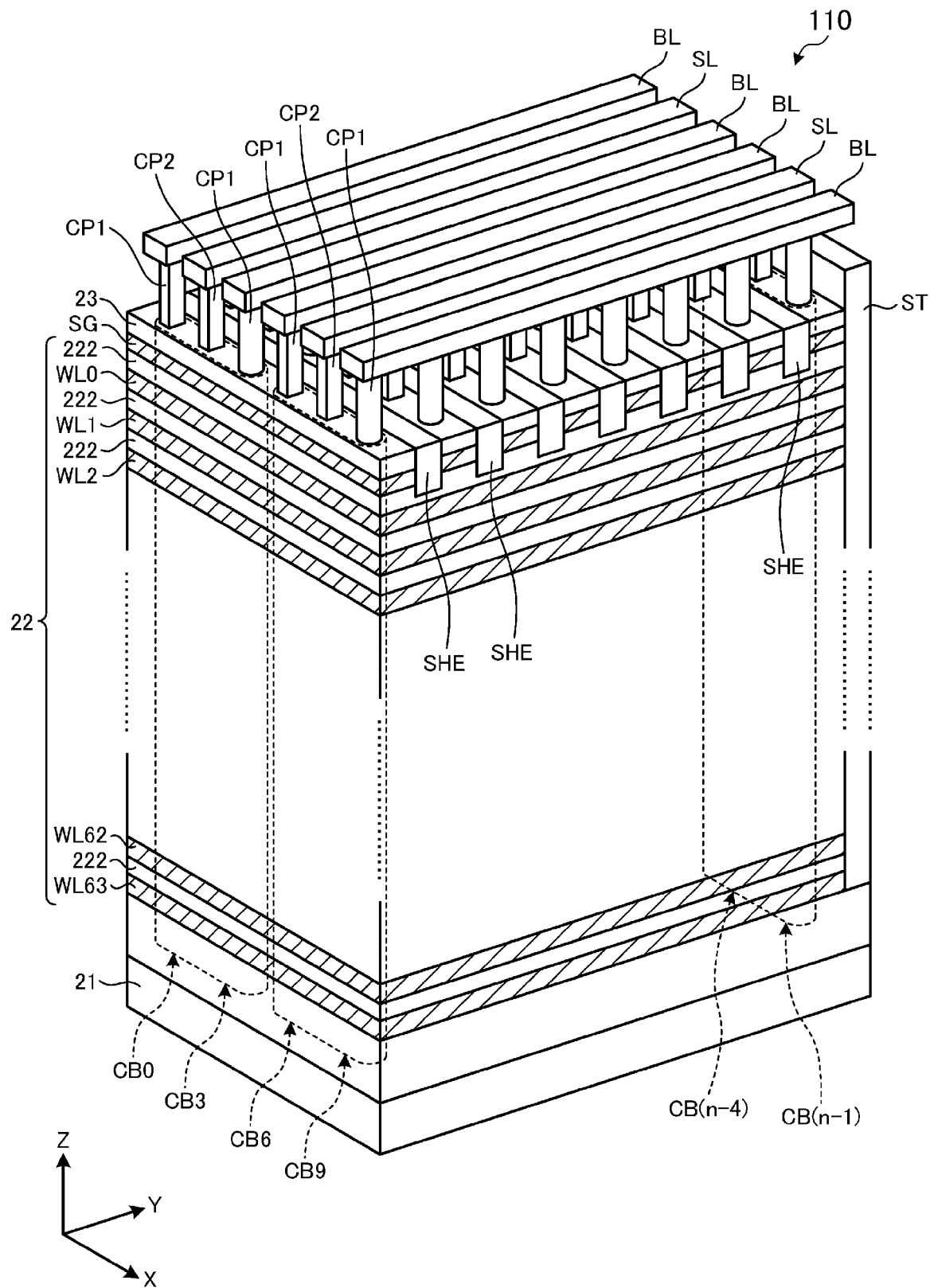
FIG. 3 is a perspective view of a cell array of the variable resistance non-volatile memory according to the first embodiment.

FIG. 3 is a perspective view of the cell array 110 of the variable resistance non-volatile memory 100 according to the first embodiment. In FIG. 3, the extending direction of the bit line BL is the Y direction, the stacking direction of the memory cell MC is the Z direction, and the direction perpendicular to the Y direction and the Z direction is the X direction. As shown in FIG. 3, in the cell array 110, the columnar cell blocks CB are two-dimensionally arranged in the XY direction on the +Z side of the semiconductor substrate 21, and a stacked body 22 is penetrated by the columnar cell block CB in the Z direction to form a three-dimensional array of the memory cells MC.

A plurality of stacked bodies including the stacked body 22 are disposed on the +Z side of the semiconductor substrate 21. The plurality of stacked bodies are arranged at different positions in the Y direction with a separation portion ST interposed therebetween. At least the surface of the separation portion ST in contact with the stacked body 22 is formed of an insulating material, and electrically separates the stacked body 22 from the other stacked bodies. The separation portion ST has a substantially fin shape extending along the XZ direction.

In the stacked body 22, a word line WL and an insulating layer 222 are alternately and repeatedly stacked in the Z direction. The word line WL is configured as a plate-shaped conductive film extending in the XY direction. Hereinafter, the word line WL may be referred to as a conductive film WL. In the stacked body 22, a plurality of conductive films WL0 to WL63 are arranged apart from each other in the Z direction. Each conductive film WL is formed of a material containing a conductive material (for example, a metal such as tungsten) as a main component. Each insulating layer 222 is formed of a material containing an insulating material (for example, silicon oxide) as a main component.

A cell block select line SG is stacked in the Z direction on the uppermost insulating layer 222 of the stacked body 22. The cell block select line SG is configured as a plate-shaped conductive film extending in the XY direction. Hereinafter, the cell block select line SG may also be referred to as a conductive film SG. The conductive film SG is formed of a material containing a conductive material (for example, a metal such as tungsten) as a main component. The conductive film SG is divided in the Y direction by a dividing film SHE. The dividing film SHE is provided above the conductive film WL (+Z side), extends in the XZ direction, and reaches the uppermost insulating layer 222 of the stacked body 22. The dividing film SHE is formed of an insulating material (for example, silicon oxide). As a result, the cell block select lines SG are electrically isolated from each other.

Each cell block CB extends in the Z direction and penetrates the stacked body 22 in the Z direction. The cell block CB is configured as a columnar structure that penetrates the plurality of conductive films WL0 to WL63 in the Z direction. The plurality of cell blocks CB0 to CB(n−1) are two-dimensionally arranged in the XY direction. Each cell block CB includes a semiconductor film CH extending in the Z direction and functioning as a semiconductor channel (see FIG. 4). The semiconductor film CH penetrates the stacked body 22 in the Z direction and functions as a semiconductor channel. The memory cell MC is located at a position in which the semiconductor film CH and the conductive film WL intersect, and the cell block select transistor SGD is located at a position in which the semiconductor film CH and the conductive film SG intersect.

An interlayer insulating film 23 is disposed on the conductive film SG (+Z side). The interlayer insulating film 23 is formed of a material containing an insulating material (for example, silicon oxide) as a main component.

The plurality of bit lines BL and the plurality of source lines SL are disposed on the +Z side of the interlayer insulating film 23. The plurality of bit lines BL are arranged in the X direction. Each of the plurality of source lines SL is arranged in the X direction alternately with the plurality of bit lines BL. Each of the bit line BL and the source line SL is configured as a line-shaped conductive film extending in the Y direction. Each of the bit line BL and the source line SL is formed of a material containing a conductive material (for example, a metal such as tungsten, copper, or aluminum) as a main component.

A contact plug CP1 may be disposed between the bit line BL and the semiconductor film CH. In this case, the contact plug CP1 is in contact with the bit line BL at the upper end, is in contact with the semiconductor film CH at the lower end, and electrically couples the bit line BL and the semiconductor film CH. The contact plug CP1 is formed of a material containing a conductive material (for example, a metal such as tungsten) as a main component.

A contact plug CP2 may be disposed between the source line SL and the local source line LSL. In this case, the contact plug CP2 is in contact with the source line SL at the upper end, is in contact with the local source line LSL at the lower end, and electrically couples the source line SL and the local source line LSL. The contact plug CP2 is formed of a material containing a conductive material (for example, a metal such as tungsten) as a main component.

A set of the two cell blocks CB adjacent to each other in the X direction forms a pair, and each cell block CB belongs to only one pair. Therefore, the cell block CB0 and the cell block CB3 form a pair, and the cell block CB6 and the cell block CB9 form a pair, but the cell block CB3 and the cell block CB6 do not form a pair.

Structure of Cell Block CB

Figure 4:
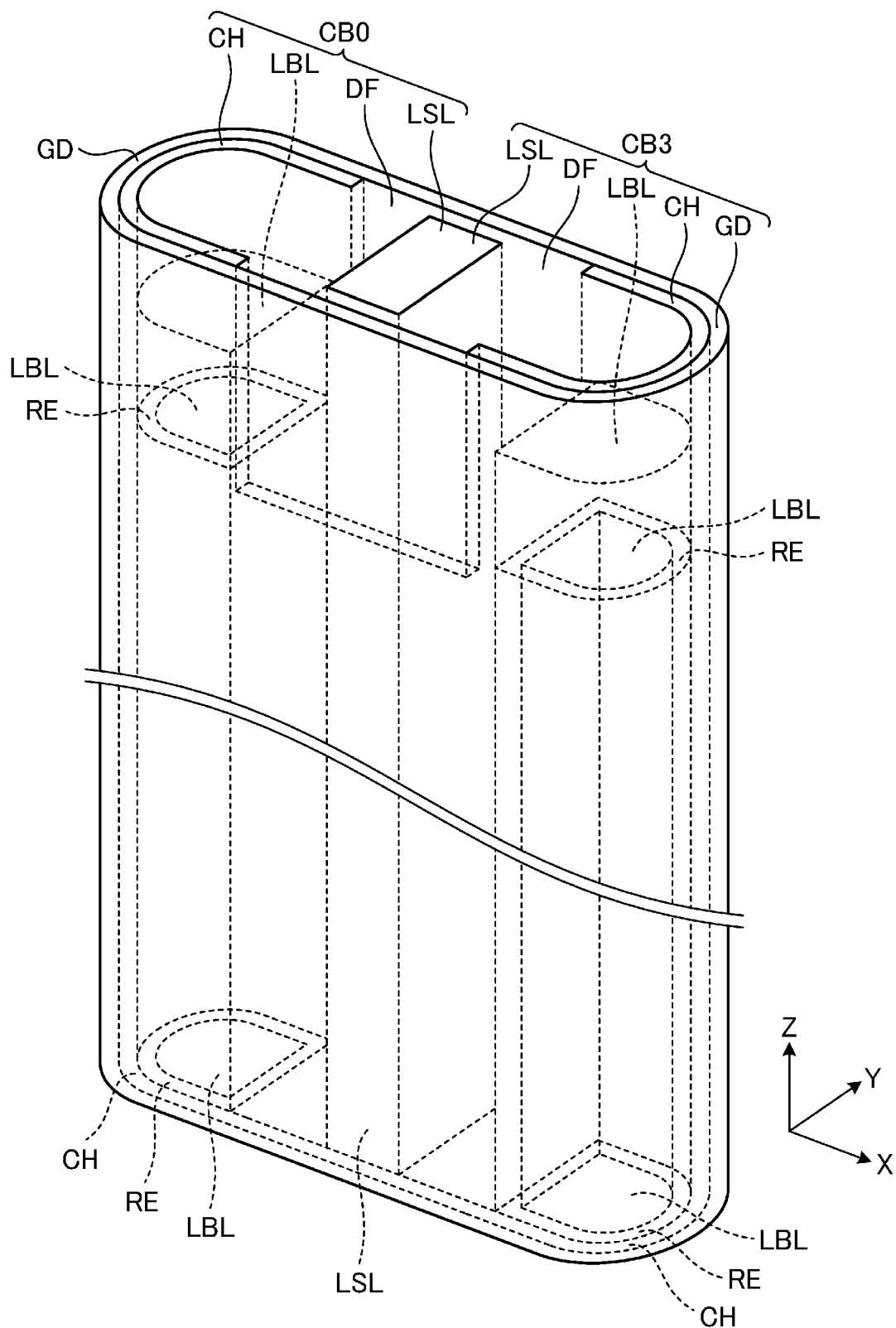
FIG. 4 is a perspective view of a cell block of the variable resistance non-volatile memory according to the first embodiment.
Figure 5:
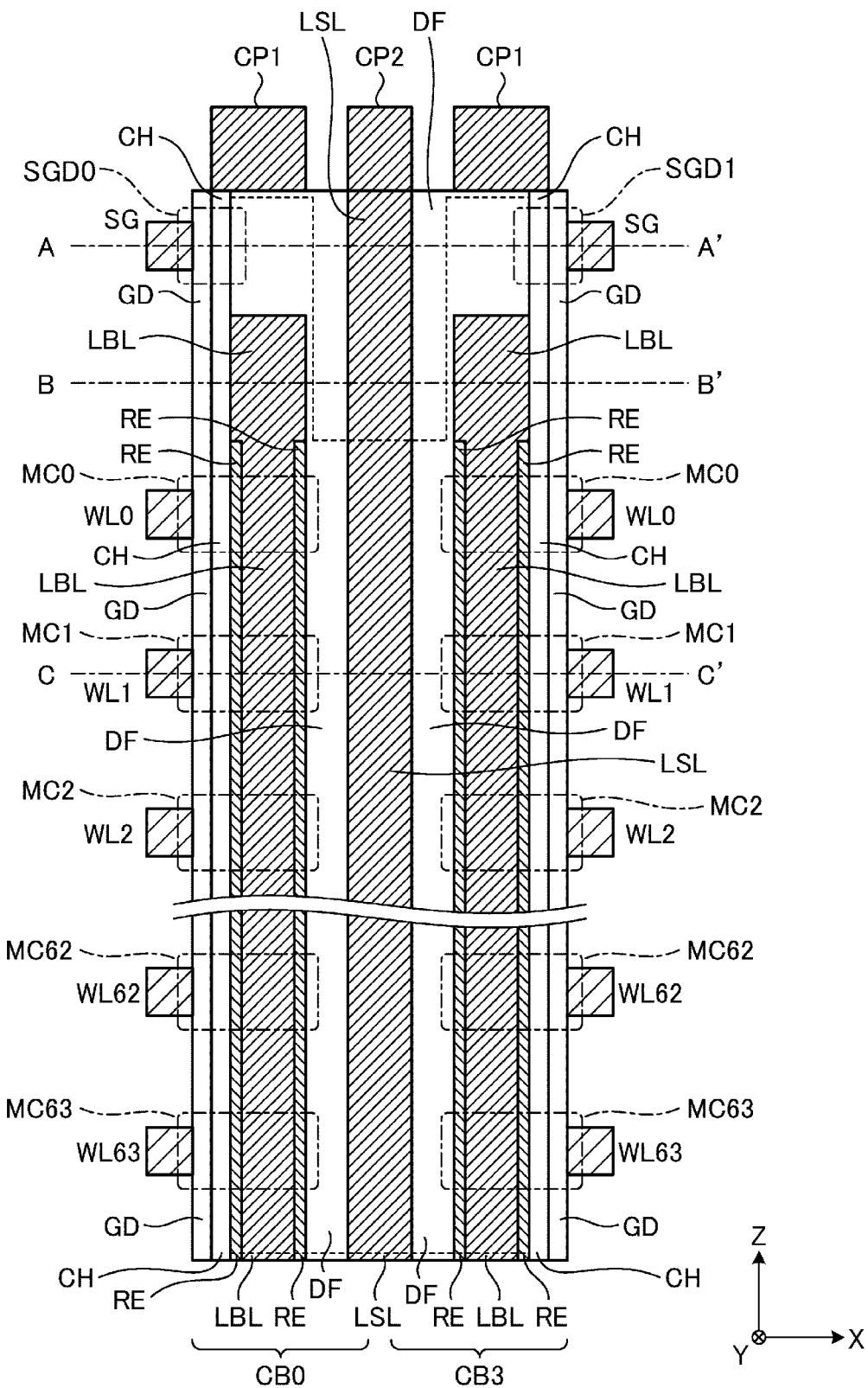
FIG. 5 is a cross-sectional view taken along XZ plane of the cell block of the variable resistance non-volatile memory according to the first embodiment.
Figure 6A:
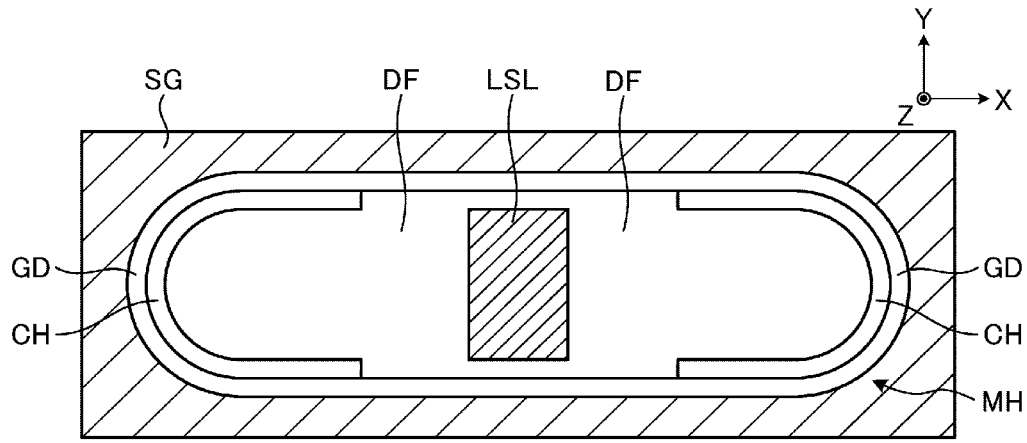
Figure 6B:
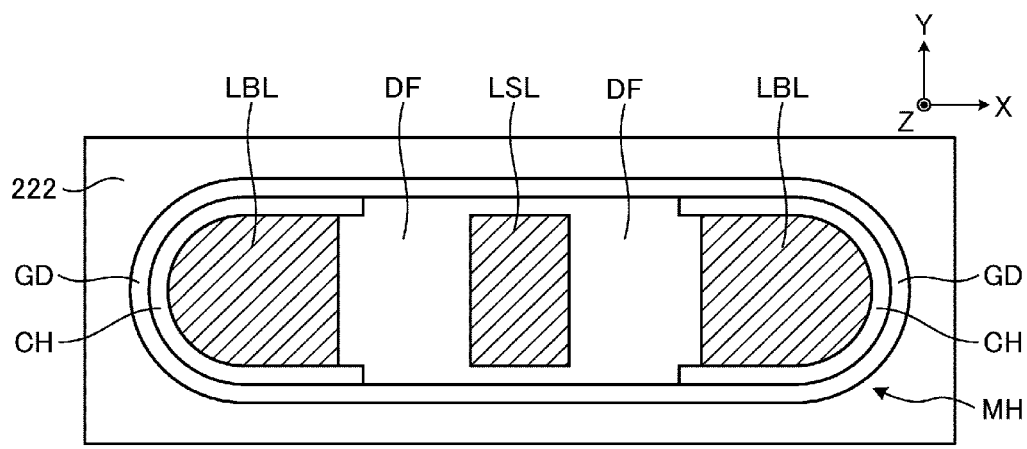
Figure 6C:
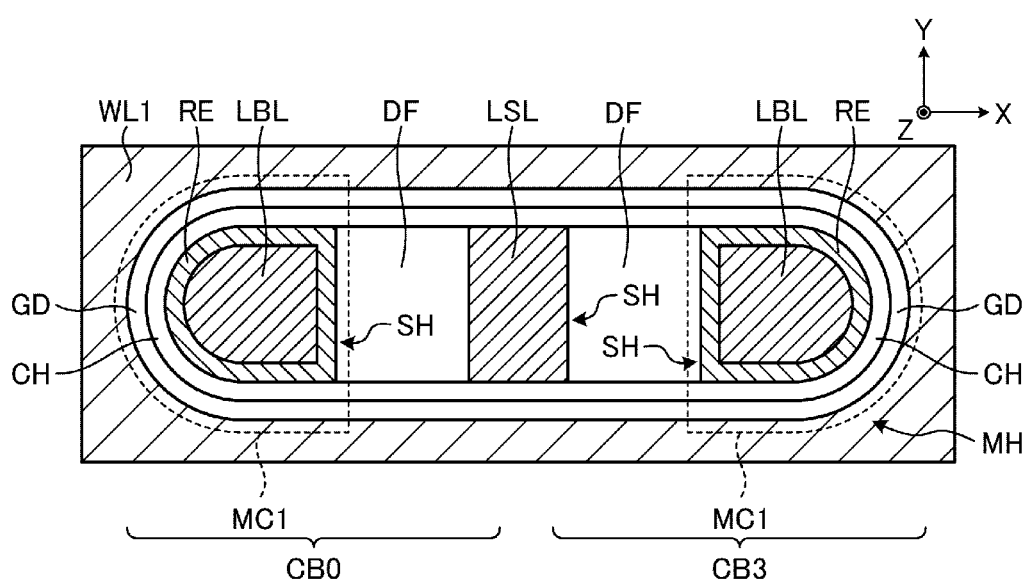

A set of the two cell blocks CB adjacent to each other in the X direction is configured as shown in FIGS. 4 to 6, for example. FIG. 4 is a perspective view of the cell blocks CB0 and CB3. FIG. 4 shows the configuration of a set of the two cell blocks CB0 and CB3. FIG. 5 is a cross-sectional view taken along the XZ plane of the cell blocks CB0 and CB3. The XZ cross section passing through the central axis of the cell block CB is shown. In FIG. 5, for the sake of simplicity, the illustration of the insulating layer between the word line WL and the word line WL is omitted. FIG. 6A is a cross-sectional view taken along line A-A' in FIG. 5. FIG. 6B is a cross-sectional view taken along line B-B' in FIG. 5. Further, FIG. 6C is a cross-sectional view taken along line C-C' in FIG. 5. Further, in FIGS. 4 to 6C, the heat barrier film and the heat generation film are omitted. The configuration including the heat barrier film and the heat generation film will be described in detail in FIG. 12.

Each of the cell block CB0 and the cell block CB3 in the set is configured as a columnar structure as shown in FIGS. 4 to 6. The columnar structure has an XY planar shape with the X direction as the longitudinal direction, and has a three-dimensional shape extending in the Z direction with a columnar shape in the XY cross-section. The columnar structure of the cell block CB0 and the columnar structure of the cell block CB3 are combined in the X direction, and the set of the cell block CB0 and the cell block CB3 has a substantially elliptical columnar shape.

The columnar structure of each cell block has a gate insulator film GD, the semiconductor film CH, the local bit line LBL, the local source line LSL, and the variable resistance film RE.

The local source line LSL is shared by the set of the cell block CB0 and the cell block CB3. Other configurations in the columnar structure are not shared and provided in each of the cell block CB0 and the cell block CB3.

The gate insulator film GD extends in the Z direction and penetrates the plurality of conductive films WL0 to WL63. The gate insulator film GD has a substantially elliptical tubular shape.

The semiconductor film CH extends in the Z direction inside the gate insulator film GD and penetrates the plurality of conductive films WL0 to WL63. The semiconductor film CH has a substantially elliptical tubular shape, and the outer side surface of the semiconductor film CH is in contact with the inner side surface of the gate insulator film GD.

The local bit line LBL extends in the Z direction inside the semiconductor film CH and penetrates the plurality of conductive films WL0 to WL63. The local bit line LBL has a substantially semi-columnar shape (i.e., a shape of a column that is cut in half along its central longitudinal axis).

The local source line LSL extends in the Z direction inside the semiconductor film CH and penetrates the plurality of conductive films WL0 to WL63. The local source line LSL has a substantially prism shape.

The variable resistance film RE penetrates a plurality of conductive films WL0 to WL63 inside the semiconductor film CH and outside the local bit line LBL. The variable resistance film RE includes a portion in contact with the semiconductor film CH and a portion in contact with the local bit line LBL. That is, the variable resistance film RE has a substantially semi-cylindrical shape, the outer side surface of the variable resistance film RE is in contact with the inner side surface of the semiconductor film CH, and the inner side surface of the variable resistance film RE is in contact with the outer side surface of the local bit line LBL.

Equivalent Circuit of Cell Block

Figure 7:
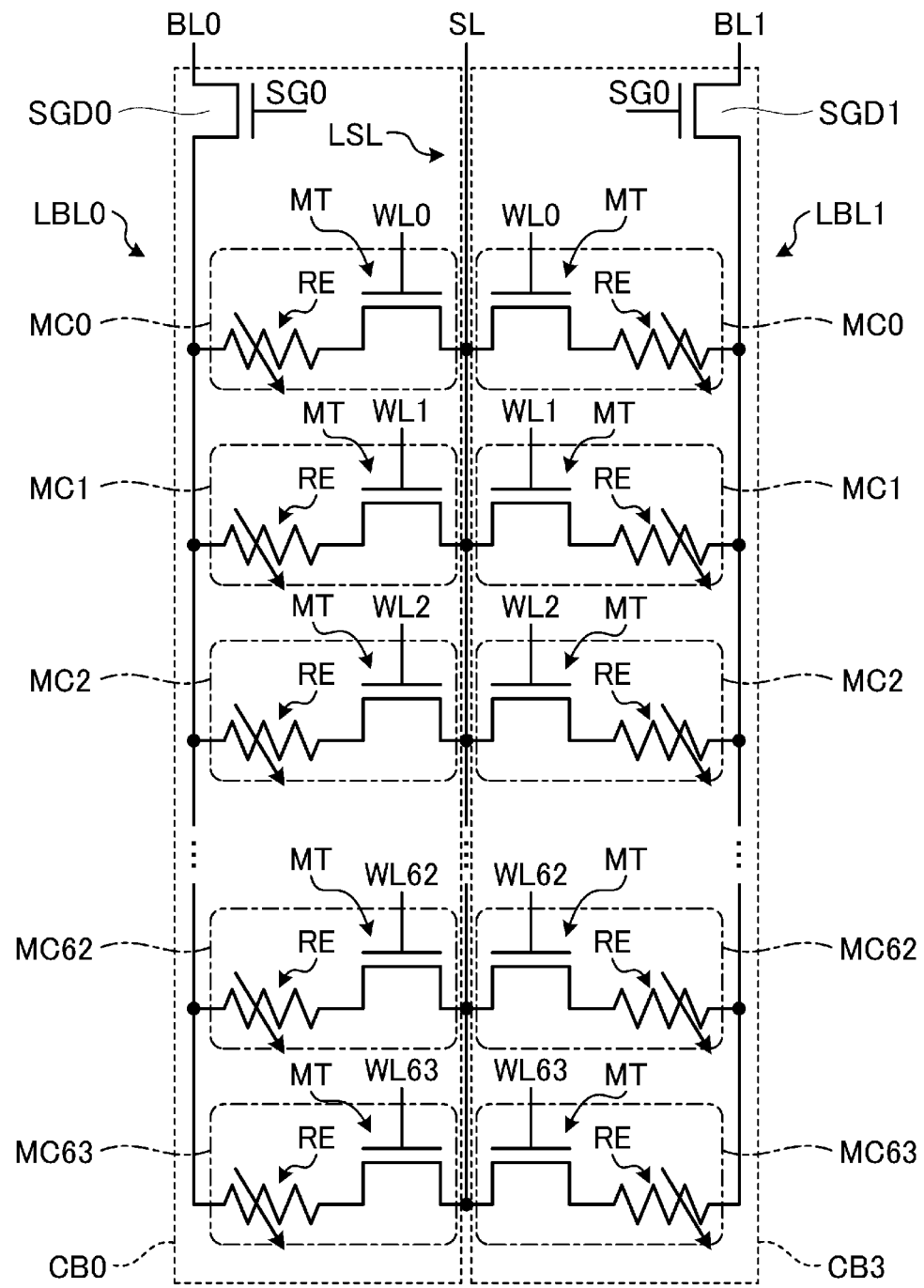
FIG. 7 is a circuit diagram of the cell block of the variable resistance non-volatile memory according to the first embodiment.

FIG. 7 is a circuit diagram of the cell blocks CB0 and CB3. As shown in FIG. 7, the memory cell MC includes the cell transistor MT coupled to the word line WLi (i=0 to 63) and the variable resistance element RE of a two-terminal type that are connected in series. A plurality of memory cells MC0 to MC63 are coupled to the word lines WL0 to WL63, and are connected in parallel between a common local bit line (local bit lines LBL0 and LBL1) and the common local source line LSL. The local bit lines LBL0 and LBL1 are coupled to the bit lines BL0 and BL1 via the cell block select transistors SGD0 and SGD1.

With the configuration, the cell block select transistors SGD0 and SGD1 are turned on to select the cell blocks CB0 and CB3, and the cell transistor MT linked to the selected word line WL in the selected cell blocks CB0 and CB3 is turned on, so that it is possible to selectively apply a voltage and a current to the variable resistance element RE of the selected memory cell MC and so that read and write are possible. Further, the number of transistors in the current path between the bit lines BL0 and BL1 and the source line SL are limited to two, and although the ON resistance of the transistors is high, the current sufficiently enabling Set and Reset operations of the variable resistance element RE can be supplied.

In the example, an equivalent circuit of the two cell blocks CB0 and CB3 on the left and the right, which have the common local source line LSL, is shown. The common word line WL1 and a cell block control line SG0 are used, and the memory cells MC of the two cell blocks CB0 and CB3 may be read and written at the same time.

Figure 8:
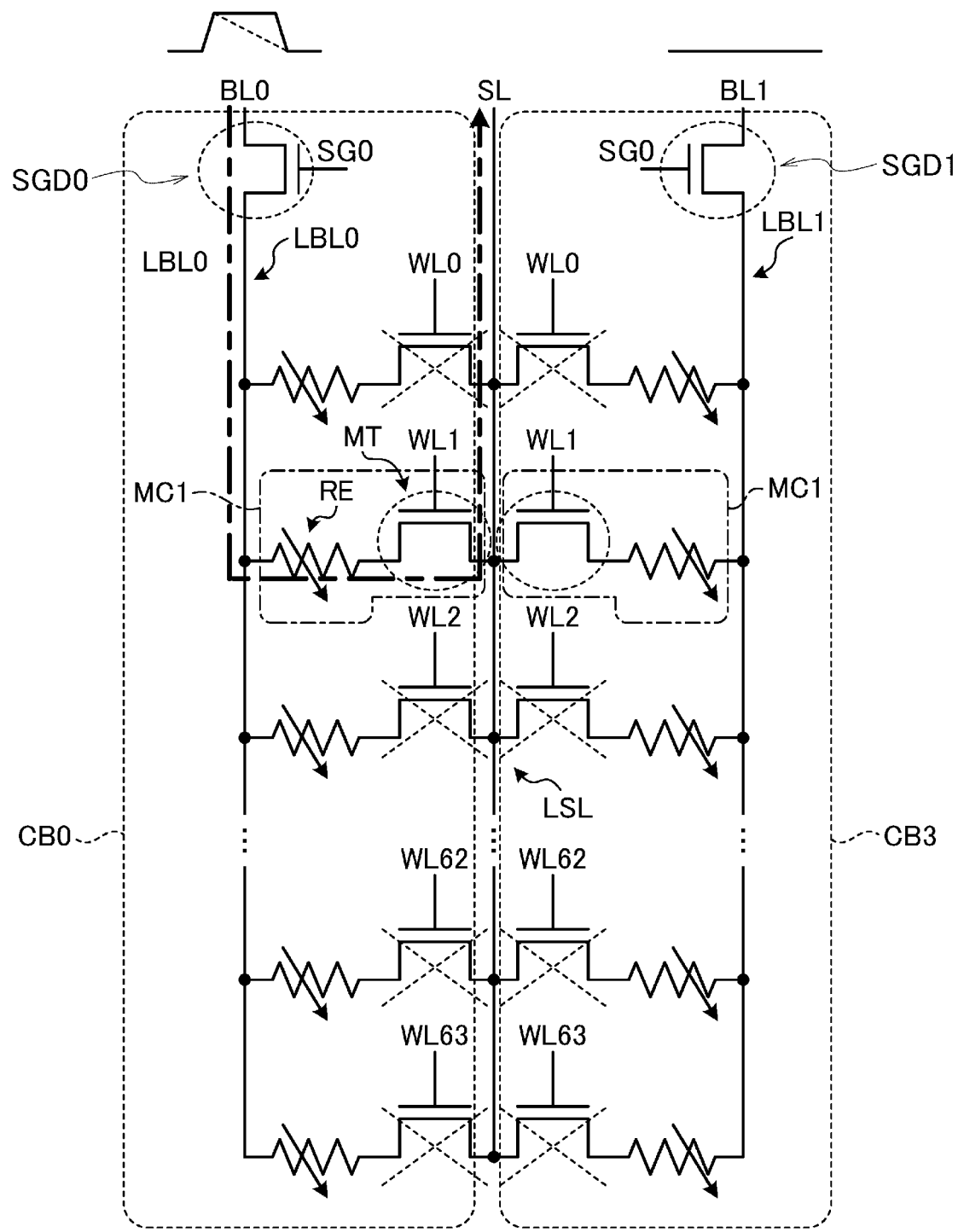
FIG. 8 is an operation circuit diagram of the cell block of the variable resistance non-volatile memory according to the first embodiment.

FIG. 8 is a circuit diagram showing the operation of the cell block CB, and the current path when the selected word line is WL1 is shown by an alternate long and short dash line. At this time, since the amount of current changes according to the resistance state (Set and Reset states) of the variable resistance film RE, the read operation becomes possible. The cell transistor MT disposed in the opening of the stacked word line WL is usually a polysilicon channel and has very low mobility compared to a bulk transistor, but since the number of transistors (in the case of FIG. 8, the cell block select transistor SGD0 and the one cell transistor MT) of the cell block CB0 at the time of access is two, a sufficiently large cell current can flow. Consequently, the Set and Reset drive operation of the variable resistance element RE becomes easy. When the local bit lines LBL0 and LBL1 and the local source line LSL are formed of low resistance tungsten and the like, the cell current during the read and write operation of the variable resistance element RE is hardly reduced although the number of the stacked word lines WL is increased, so that low cost memory can be obtained.

As described above, the plurality of word lines are configured as a plurality of conductive films stacked apart from each other, and the cell block is configured as a columnar structure penetrating the plurality of conductive films in the stacking direction. The structure can be formed by providing a memory hole MH in a stacked body in which an insulating layer and a sacrificial layer SF are alternately stacked, and embedding the one or several cell blocks CB in the memory hole MH, so that the manufacturing cost can be reduced greatly. Further, since the block select transistor is coupled to the parallel connection of a plurality of memory cells to form a cell block, the number of transistors through which the cell current passes during operation in the cell block are limited to two. As a result, the cell current can be easily increased, and the Set and Reset drive operation of the variable resistance element RE becomes easy. Consequently, it is possible to provide a memory with a high degree of integration and low cost.

Further, when the local bit line LBL or the local source line LSL is formed of low resistance tungsten and the like, the cell current during read and write operation is hardly reduced although the number of the stacked word lines WL is increased. From this point as well, it is possible to provide a memory with a high degree of integration and low cost.

Manufacturing Method

FIGS. 9A to 9D are XY cross-sectional views showing a manufacturing method of the cell array 110, respectively, and show XY cross sections cut at the Z position of the sacrificial layer SF corresponding to line C-C' of FIG. 5. Further, in FIGS. 9A to 9D, a heat barrier film HB is omitted. The formation of the heat barrier film HB can be appropriately carried out after the formation of the variable resistance film RE.

The insulating layer 222 and the sacrificial layer SF are alternately stacked a plurality of times on the +Z side of the semiconductor substrate 21 (see FIG. 3) to form a stacked body. The insulating layer 222 is formed of, for example, a material containing silicon oxide as a main component, and the sacrificial layer SF is formed of, for example, a material containing silicon nitride as a main component. In order to form the cell block CB, each of a plurality of memory holes MH penetrating the stacked body in the Z direction is formed. Each memory hole MH can be formed in a substantially elliptical shape with the X direction as the longitudinal direction in the XY cross-sectional view.

Figure 9A:
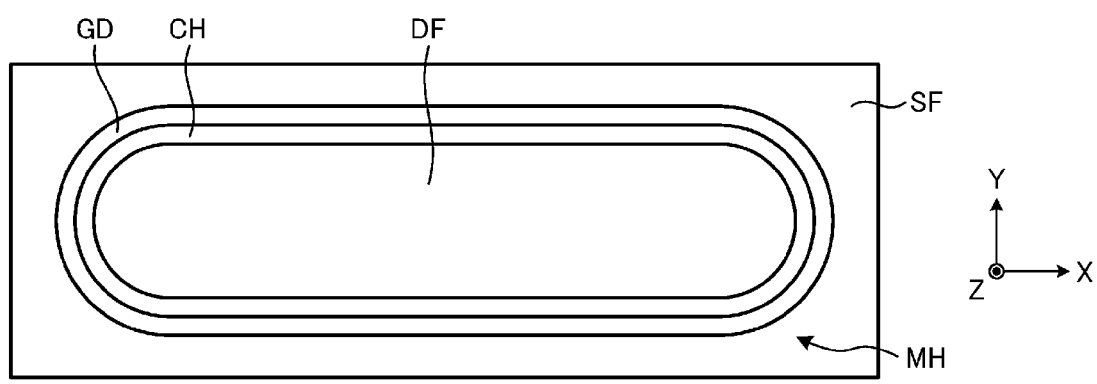
FIGS. 9A to 9D are cross-sectional views in the XY plane direction showing a manufacturing method of the variable resistance non-volatile memory according to the first embodiment.

As shown in FIG. 9A, the gate insulator film GD is deposited on the outer periphery of the side wall of each memory hole MH, the semiconductor film CH is deposited inside the gate insulator film GD, thereafter the inside of the memory hole MH is filled with the insulating film DF, and the left and right portions of the insulating film DF in the figure are removed while leaving the central portion of the insulating film DF in the figure. By selectively masking the central portion of the insulating film DF in the figure with a patterned resist using lithography, etching processing is performed to remove the left and right portions of the insulating film DF in the figure while leaving the central portion of the insulating film DF in the figure.

Figure 9B:
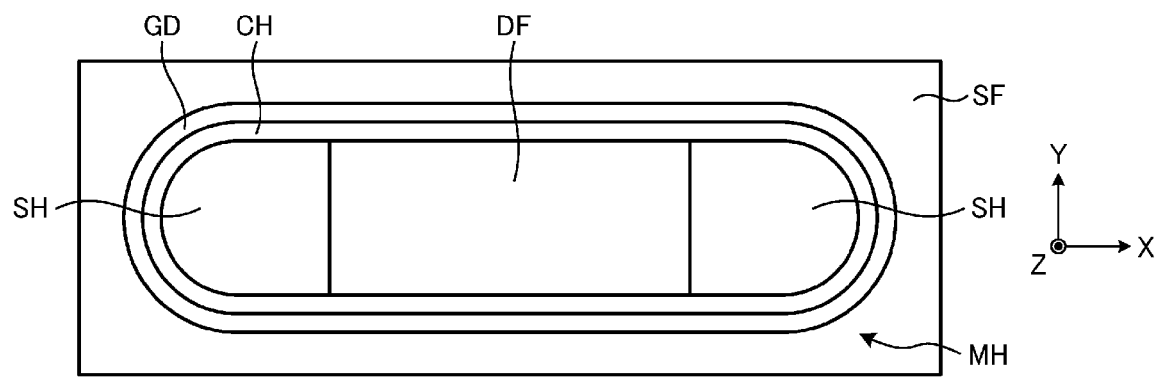

As shown in FIG. 9B, the two sub-holes SH on the left and the right in the figure are formed.

Figure 9C:
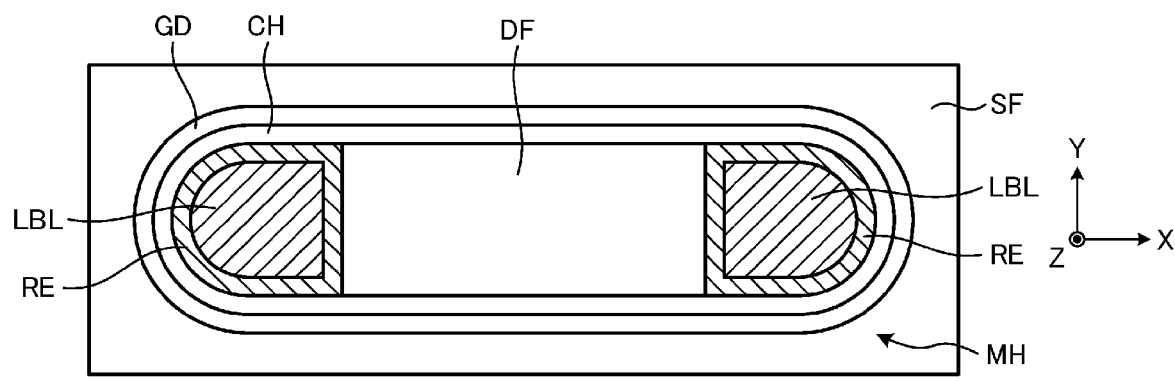

As shown in FIG. 9C, in the sub-holes SH on the left and the right in the figure, the variable resistance film RE is deposited inside the semiconductor film CH to be in contact with the semiconductor film CH, but the variable resistance film RE is removed at the Z position of the cell block select line SG and the Z position between the cell block select line SG and the conductive film WL (see FIG. 6A and FIG. 6B). In addition, the semiconductor film CH is removed at the portion near the center in the X direction at the Z position of the cell block select line SG and the Z position between the cell block select line SG and the conductive film WL (see FIG. 6A and FIG. 6B) The local bit line LBL is embedded further inside thereof, but at the Z position of the cell block select line SG, the local bit line LBL is removed and the insulating film DF is embedded (see FIG. 6A).

Figure 9D:
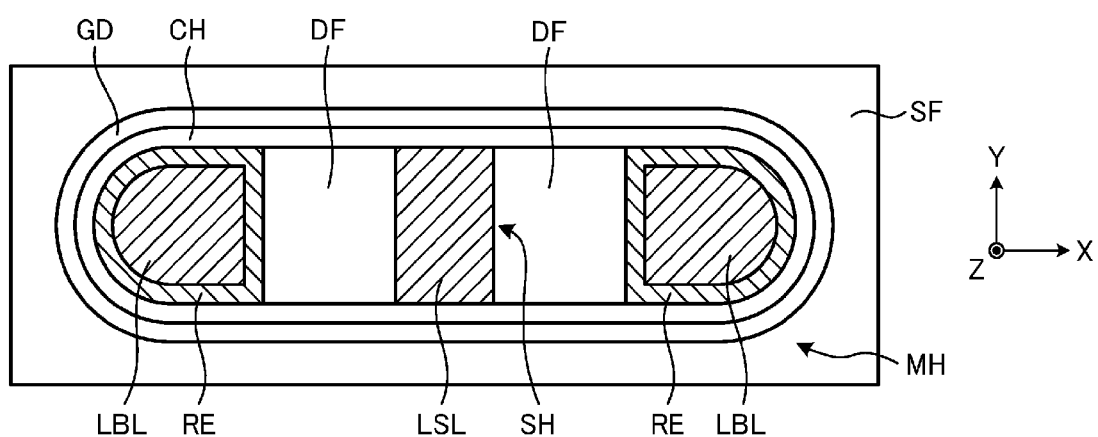

As shown in FIG. 9D, the central portion in the figure is removed while leaving the left and right portions of the insulating film DF. By masking with the patterned resist selectively exposing the central portion of the insulating film DF in the figure using lithography, etching processing is performed to remove the central portion of the insulating film DF in the figure while leaving the left and right portions of the insulating film DF in the figure. As a result, the sub-hole SH in the center of the figure is formed. The local source line LSL is filled inside the sub-hole SH in the center of the figure. At the Z position of the cell block select line SG and the Z position between the cell block select line SG and the conductive film WL, the local source line LSL is not in contact with the semiconductor film CH (see FIG. 6A and FIG. 6B), but is in contact with the semiconductor film CH (see FIG. 6C) at the Z position corresponding to the conductive film WL. Then, by removing the sacrificial layer SF and embedding the conductive film WL in the voids formed by the removal, the cell array 110 including the cell block CB shown in FIGS. 4 to 6 is manufactured.

As described above, in the manufacturing method in which the two cell blocks CB are formed in the memory hole MH, the variable resistance film RE of the two cell blocks CB is deposited at the same time. The local bit line LBL of the two cell blocks CB is embedded at the same time. As a result, since the number of manufacturing processes can be reduced and the manufacturing cost can be reduced, a low cost memory can be obtained.

Manufacturing Method According to a Modification Example

When there is a misalignment between the two performances of lithography, the distance between the local source line LSL and the local bit line LBL may change (and so, the semiconductor channel length may change), and the operation characteristics of the cell block CB may vary. In consideration of this, the processes shown in FIGS. 10A to 10C instead of the processes shown in FIGS. 9B to 9D may be performed on the cell array 110. Further, in FIGS. 10A to 10C, the heat barrier film HB is omitted. The formation of the heat barrier film HB can be appropriately carried out after the formation of the variable resistance film RE.

Figure 10A:
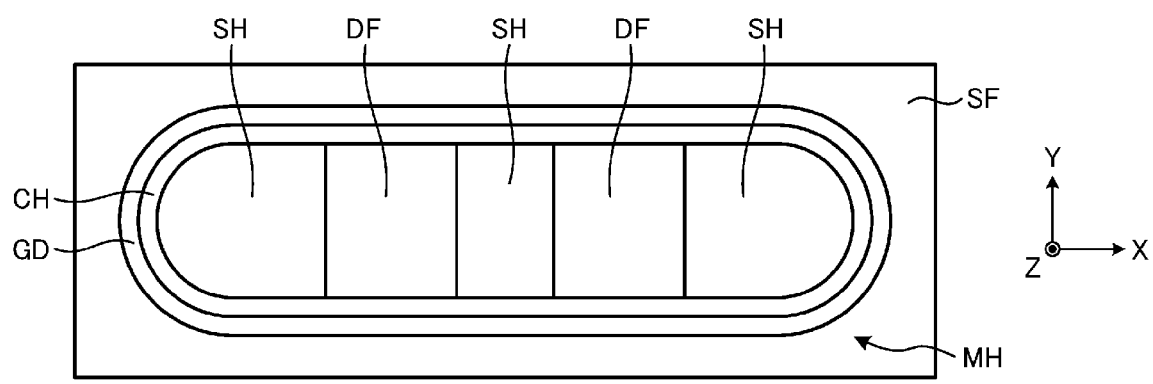
FIGS. 10A to 10C are cross-sectional views in the XY plane direction showing a manufacturing method of a variable resistance non-volatile memory according to a modification example of the first embodiment.

By performing etching processing using the patterned resist that masks the central portion and the portion on the left and right sides of the insulating film DF shown in FIG. 9A, the three sub-holes SH are formed in the center and the left and right sides in the figure as shown in FIG. 10A.

Figure 10B:
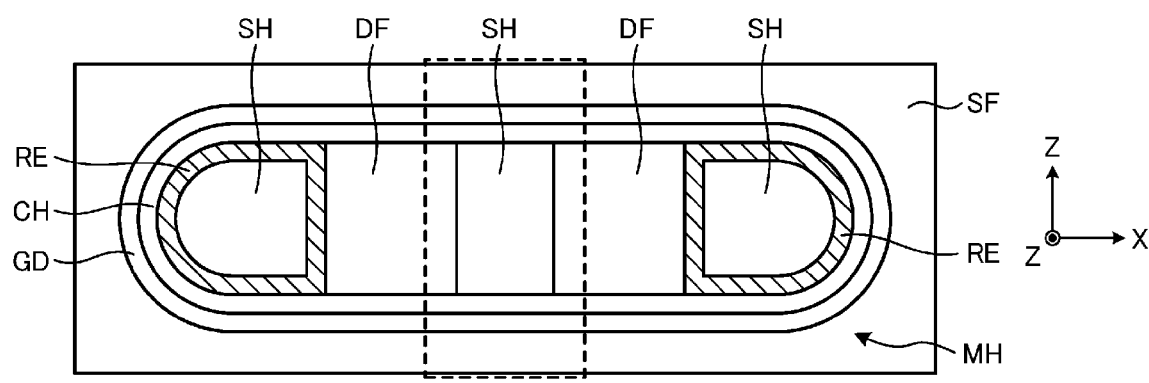

As shown by the dotted line in FIG. 10B, by masking with the patterned resist that selectively covers the sub-hole SH in the center of the figure, the variable resistance film RE is deposited in the sub-holes SH on the left and the right in the figure, and the variable resistance film RE is removed at the Z position of the cell block select line SG and the Z position between the cell block select line SG and the conductive film WL (see FIGS. 6A and 6B).

Figure 10C:
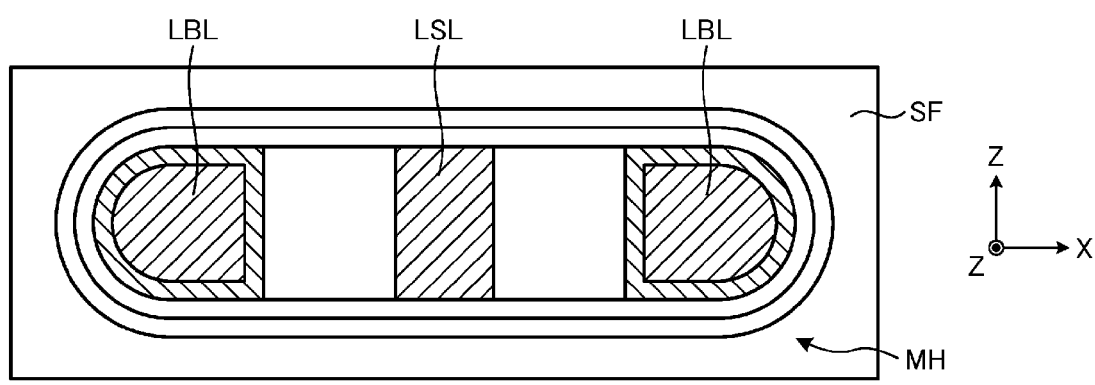

After that, as shown in FIG. 10C, the masking is removed, and the local bit line LBL is filled further inside the sub-holes SH on the left and the right in the figure, and the local source line LSL is filled in the sub-hole SH in the center of the figure. At the Z position of the cell block select line SG, the local bit line LBL is removed, and the insulating film DF is embedded (see FIG. 6A). In the sub-holes SH on the left and the right in the figure, the local bit line LBL is removed at the Z position of the cell block select line SG.

In this way, the three sub-holes SH in the center and the left and the right in the figure can be formed at the same time, and the distance between the local source line LSL and the local bit line LBL can be easily formed to be a desired distance. As a result, variations in the operation characteristics of the cell block CB can be prevented.

Timing Chart of Operation Waveform

Figure 11:
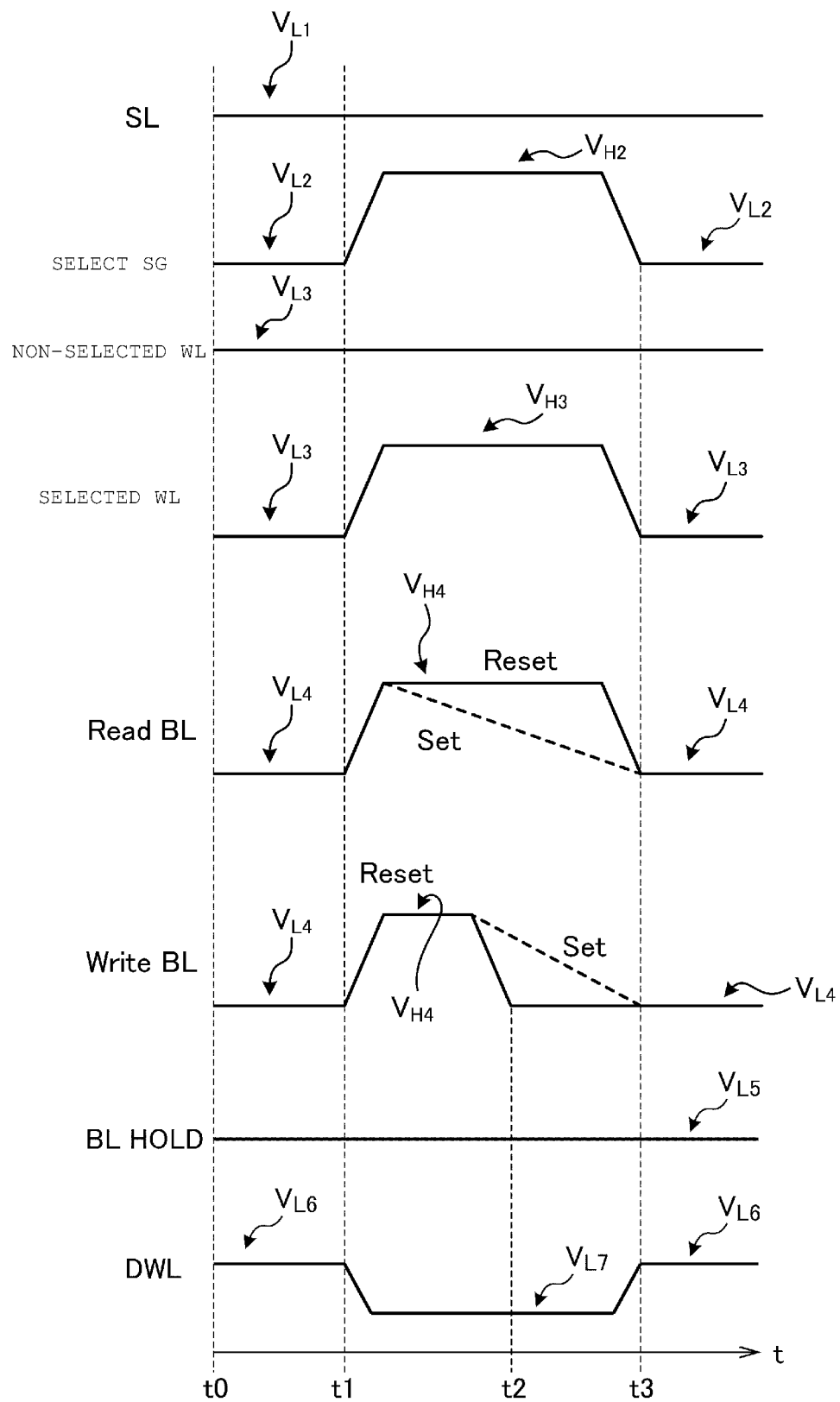
FIG. 11 is a timing chart of an operation waveform of the variable resistance non-volatile memory according to the first embodiment.

FIG. 11 is a timing chart of an operation waveform of the variable resistance non-volatile memory according to the first embodiment. FIG. 11 shows an operation example of a string block. When the memory cell MC is not selected, the cell transistor MT is in the off state (non-conducting state). When the cell transistor MT is in the off state, an inversion layer cannot be formed on the semiconductor film of the cell transistor MT. Consequently, almost no current flows through the semiconductor film, and no current flows through the variable resistance element RE. When the memory cell MC is selected, the cell transistor MT is in the on state (conducting state). Since an inversion layer is formed on the semiconductor film of the cell transistor MT, the current flows through the inversion layer. The current also flows through the variable resistance element RE connected in series with the cell transistor MT.

In FIG. 11, the standby operation is performed before a timing t1. The row decoder 120 maintains the source line SL at a low level $V_{L1}$ (for example, $V_{L1}$=0 V), maintains the cell block select line SG at a low level $V_{L2}$ (for example, $V_{L2}$=0 V or a negative voltage), and maintains both the non-selected word line WL and the selected word line WL at a low level $V_{L3}$ (for example, $V_{L3}$=0 V). The low level $V_{L3}$ of the word line WL may be a negative voltage (for example, −2V) to improve the off characteristic of the cell transistor MT. Since the cell block select transistor SGD is maintained in the off state, the bit line BL may be 0 V or any voltage.

At the timing t1, the read and write operation is started. The row decoder 120 transitions the signal of the cell block select line SG from the low level $V_{L2}$ to a high level $V_{H2}$, and selects the cell block CB0.

When the memory cell MC1 corresponding to the word line WL1 is selected (see FIG. 8), the signal of the word line WL1 transitions from the low level $V_{L3}$ to a high level $V_{H3}$, and the signals of the word lines WL0 and WL2 to WL63 are maintained at the low level $V_{L3}$. In the signal of the word line WL1, the low level $V_{L3}$ is the non-selected voltage, and the high level $V_{H3}$ is the selected voltage.

As a result, the memory cell MC1 corresponding to the cell block select line SG0 and the word line WL1 in the cell block CB0 can be accessed. That is, the bit line BL0 and the source line SL are conductive via the variable resistance element RE of the selected memory cell MC1. With a state in which the one memory cell MC is selected, when the selected bit line BL0 among the plurality of bit lines BL0 and BL1 is raised from a low level $V_{L4}$ to a high level $V_{H4}$ while the source line SL is fixed to the low level $V_{L1}$, and the remaining bit line BL1 is fixed to the low level $V_{L4}$, a current flows through between the selected bit line BL0 and the source line SL. As for the voltage of the bit line BL0, the high level $V_{H4}$ is the selected voltage, and the low level $V_{L4}$ is the non-selected voltage.

At the time of reading, at the timing t1, the row decoder 120 raises the selected bit line BL0 from the low level $V_{L4}$ to the high level $V_{H4}$ and then makes the selected bit line BL0 go into an electrically floating state. According to this, when the selected memory cell MC is in the high resistance state (Reset state), the voltage of the bit line BL0 does not drop and is maintained at the vicinity of the high level $V_{H4}$. As a result, the sense amplifier 140 detects that the voltage of the bit line BL0 is the high level $V_{H4}$, and "1" is read from the memory cell MC. When the memory cell MC is in the low resistance state (Set state), the voltage of the bit line BL0 drops to the low level $V_{L4}$. As a result, the sense amplifier 140 detects that the voltage of the bit line BL0 is the low level $V_{L4}$, and "0" is read out from the memory cell MC. At this time, the number of transistors through which the cell current in the cell block CB0 passes is two.

At the time of writing, at the timing t1, the sense amplifier 140 raises the voltage of the bit line BL0 to be written from the low level $V_{L4}$ to the high level $V_{H4}$, and applies a current to the selected memory cell MC. Also at this time, the number of transistors through which the cell current in the cell block CB0 passes is two.

At a timing t2 after the timing t1, when the sense amplifier 140 sharply lowers the voltage of the bit line BL0 from the high level $V_{H4}$ to the low level $V_{L4}$, the variable resistance element RE of the selected memory cell MC is rapidly cooled to be amorphous (i.e., enters the high resistance state). As a result, the memory cell MC is in the high resistance state (Reset state), and "1" is written in the memory cell MC. When the sense amplifier 140 slowly lowers the voltage of the bit line BL0 from the high level $V_{H4}$ to the low level $V_{L4}$, the variable resistance element RE of the selected memory cell MC is slowly cooled to be crystallized (i.e., enters the low resistance state). As a result, the memory cell MC is in the low resistance state (Set state), and "0" is written in the memory cell MC.

Then, according to the completion of the read and write, each signal may be returned to the level of the pre-transition. For example, the signal of the cell block select line SG is returned from the high level $V_{H2}$ to the low level $V_{L2}$. The signal of the non-selected word line WL remains maintained at the low level $V_{L3}$. The signal of the selected word line WL is returned from the high level $V_{H3}$ to the low level $V_{L3}$.

When the bit line BL0 is in a HOLD state, the bit line BL0 is held at a hold level $V_{L5}$. Further, as will be described later, in the variable resistance non-volatile memory according to the first embodiment, when the word line WL is used as the dummy word line DSL, a low level $V_{L6}$ is applied in the timing period t0 to t1, a low level $V_{L7}$ ($V_{L7}<V_{L6}$) is applied in the timing period t1 to t3, and the low level $V_{L6}$ is applied in the timing period t3 and on.

As described above, in the variable resistance non-volatile memory 100, the number of transistors through which the cell current in the cell block CB0 passes during the read and write operation on the selected memory cell MC is two. As a result of short current path, the cell current can be easily increased, and the Set and Reset drive operation of the variable resistance element RE becomes easier.

Figure 12:
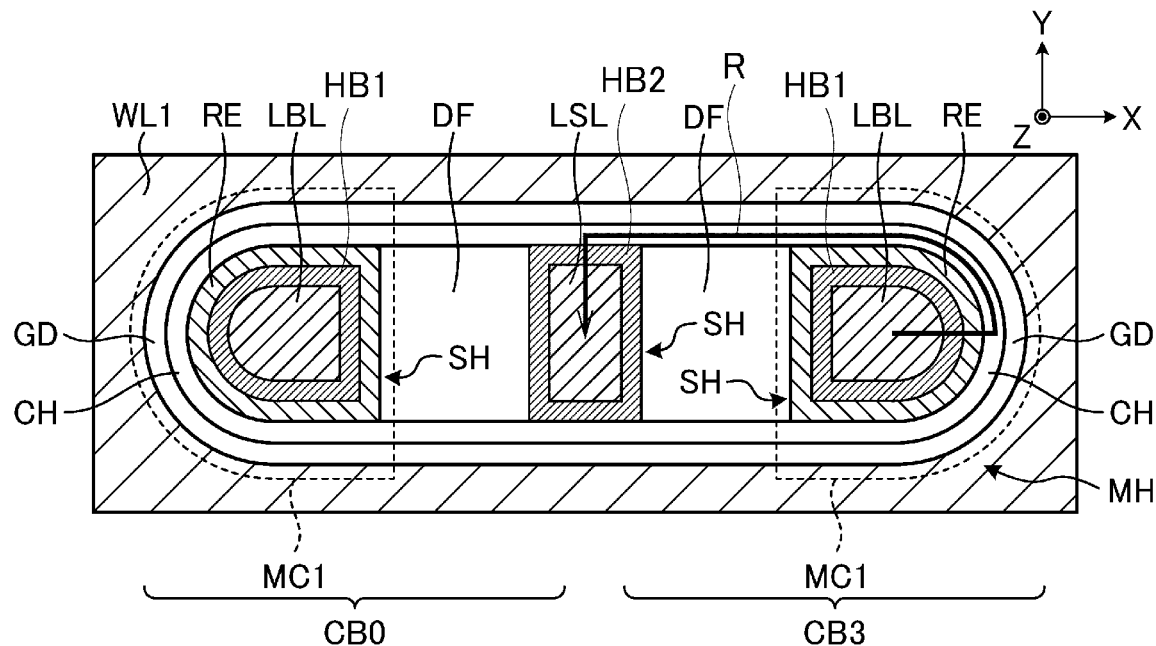
FIG. 12 shows the cell block of the variable resistance non-volatile memory according to the first embodiment, and is an explanatory view of a current conduction path in a cross-sectional view taken along the XY plane.

FIG. 12 shows the cell block of the variable resistance non-volatile memory according to the first embodiment, and is an explanatory view of a current conduction path in a cross-sectional view taken along the XY plane. In the structure example of FIG. 12, a heat barrier film HB1 is provided around the local bit line LBL, and a heat barrier film HB2 is provided around the local source line LSL. The heat barrier film HB1 is formed between the local bit line LBL and the variable resistance film RE. Further, the heat barrier film HB2 is formed between the local source line LSL and the semiconductor film CH. The current conducted between the local bit line LBL and the local source line LSL at the time of Reset writing passes through a current path R of LBL→BM1→RE→CH→BM2→LSL. Here, the heat barrier film HB1 and the heat barrier film HB2 both have the same thickness, and are formed of, for example, TiN, TaN, $TiO_x$, C, CN, C—W, C—WN, and the like. Further, a heat generation film HT may be applied instead of the heat barrier film HB1 and the heat barrier film HB2. Further, when structurally acceptable, both the heat barrier film HB1 and the heat barrier film HB2, and the heat generation film HT may be adopted. For example, the heat generation film HT may be provided on the outer periphery of the variable resistance film RE and between the semiconductor film CH and the variable resistance film RE. Further, the heat generation film HT will be described in a second embodiment (see FIG. 22B).

Figure 13:
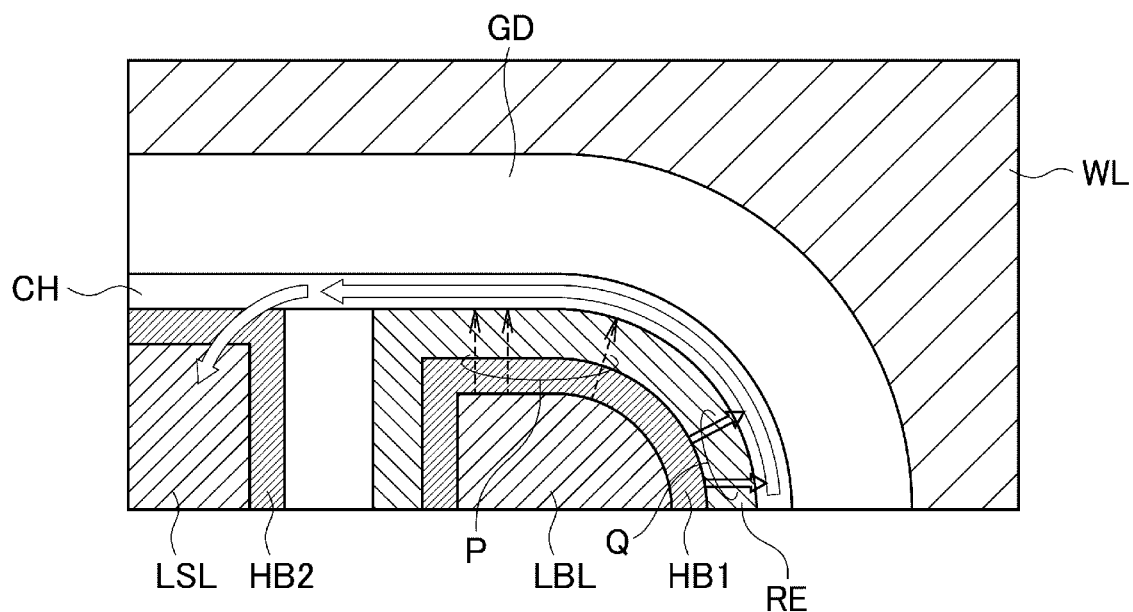
FIG. 13 shows the cell block of the variable resistance non-volatile memory according to the first embodiment, and is an explanatory view of a current conduction path in an enlarged cross-sectional view in the vicinity of the local source line and the local bit line.

FIG. 13 shows the cell block of the variable resistance non-volatile memory according to the first embodiment, and is an explanatory view of a current flow path at the time of Reset writing in an enlarged cross-sectional view in the vicinity of the local source line LSL and the local bit line LBL. As shown in FIG. 13, when the normal voltage level $V_{H3}$ is applied to the word line WL1 at the time of selection of the memory cell MC1, the voltage applied to the variable resistance element RE differs depending on a position, so that a resistance distribution occurs in the variable resistance film RE at the time of current flow and a voltage drop occurs in the semiconductor film CH. When the normal voltage level $V_{H3}$ is applied to the word line WL1 at the time of selection of the memory cell MC1, there is a portion in which the resistance is not increased by Reset writing. The portion in which the resistance is not increased by Reset writing is a portion which is not heated to a high temperature and is not made into an amorphous state. The reason why the portion in which the resistance is not increased (the portion in which the amorphous state is not achieved) occurs due to the Reset writing is that the voltage applied to the variable resistance film RE is small and the temperature is not increased due to the small voltage. For example, in the vicinity of the arrow P, since the variable resistance film RE has a high resistance as a result of becoming amorphous, the current distribution is relatively small. On the other hand, in the vicinity of an arrow Q, since the variable resistance film RE does not become amorphous and the low resistance is easily maintained, the current distribution is relatively large. The voltage of the variable resistance film RE differs depending on the position, and a voltage drop occurs in the semiconductor film CH in the current path passing through the cross section in the vicinity of the arrow Q. In the vicinity of the arrow Q, since the variable resistance film RE behaves like a low resistance film although the variable resistance film RE should have a high resistance, there is an error in reading during the read operation. As a result, the reliability of the memory operation is lowered.

On the other hand, in order to avoid such a decrease in reliability, when a voltage higher than the normal voltage level $V_{H3}$ is applied to the word line WL1 at the time of selection of the memory cell MC1, the resistance distribution at the time of the current flow through the variable resistance element RE can be prevented.

Figure 14:
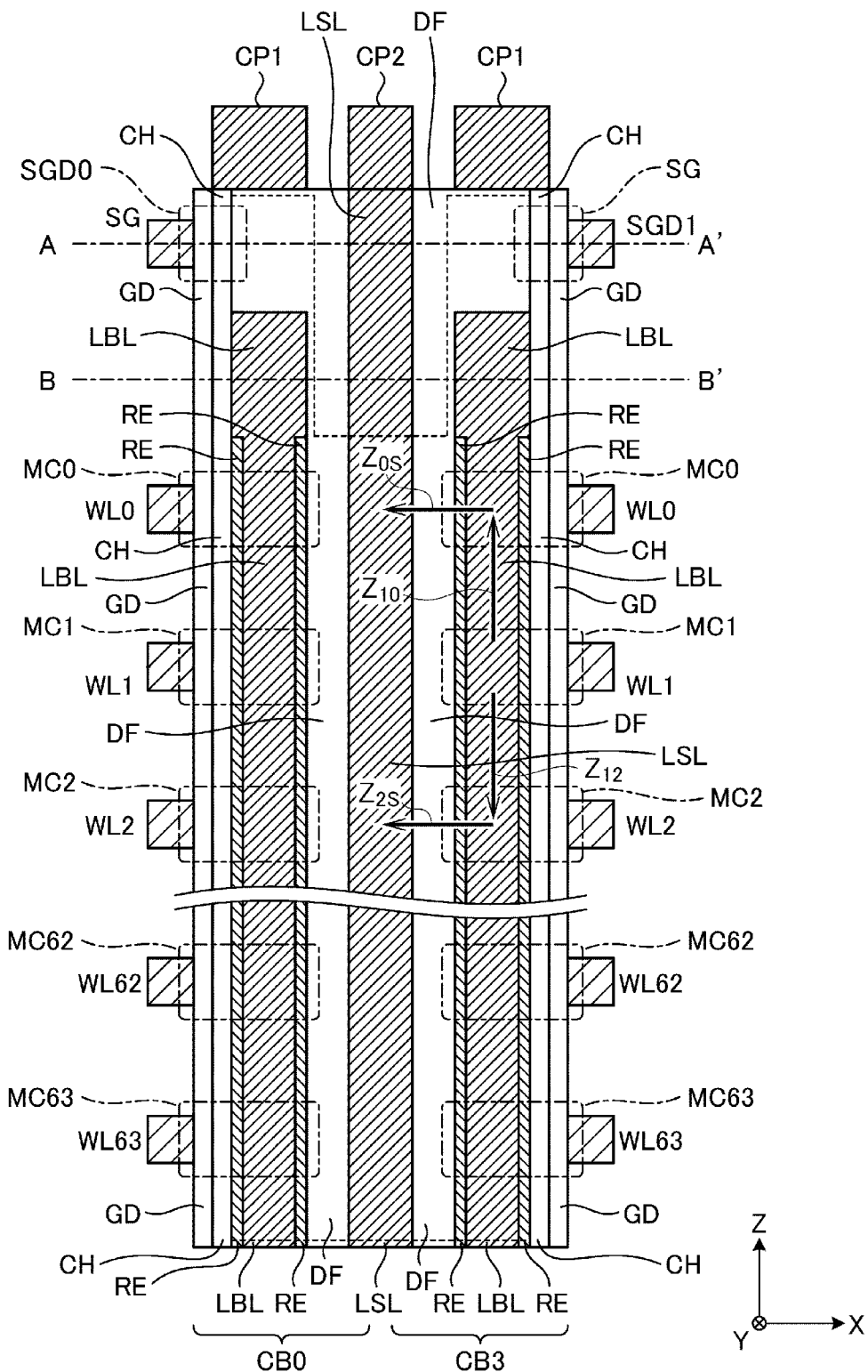
FIG. 14 is a cross-sectional view taken along the XZ plane of the cell block of the variable resistance non-volatile memory according to the first embodiment, and is an explanatory view of a leak current conduction path.

FIG. 14 is a cross-sectional view (FIG. 5) taken along the XZ plane of the cell block of the variable resistance non-volatile memory according to the first embodiment, and is an explanatory view of a current flow path leaking to the memory cells MC0 and MC2 adjacent to the upper and lower sides of the memory cell MC1. Further, in FIG. 14, the heat barrier film HB1 and the heat barrier film HB2 are omitted. When a voltage higher than the normal voltage level $V_{H3}$ is applied to the word line WL1 at the time of selection of the memory cell MC1, the current leaks to the memory cells MC0 and MC2 adjacent to the upper and lower sides of the memory cell MC1, $Z_{10} \rightarrow {}^*Z_{0S}$ and $Z_{12} \rightarrow Z_{2S}$. Since a parasitic transistor in the space portion between the WL lines is formed by the fringe electric field from the selected word line WL1, a leakage current is generated from the parasitic transistor. Due to the leakage current, thermal dispersion of cells adjacent to the top and bottom is generated, and the heat generation efficiency of the selected cell is lowered.

Example of Disposing Dummy Word Line DWL

Figure 15A:
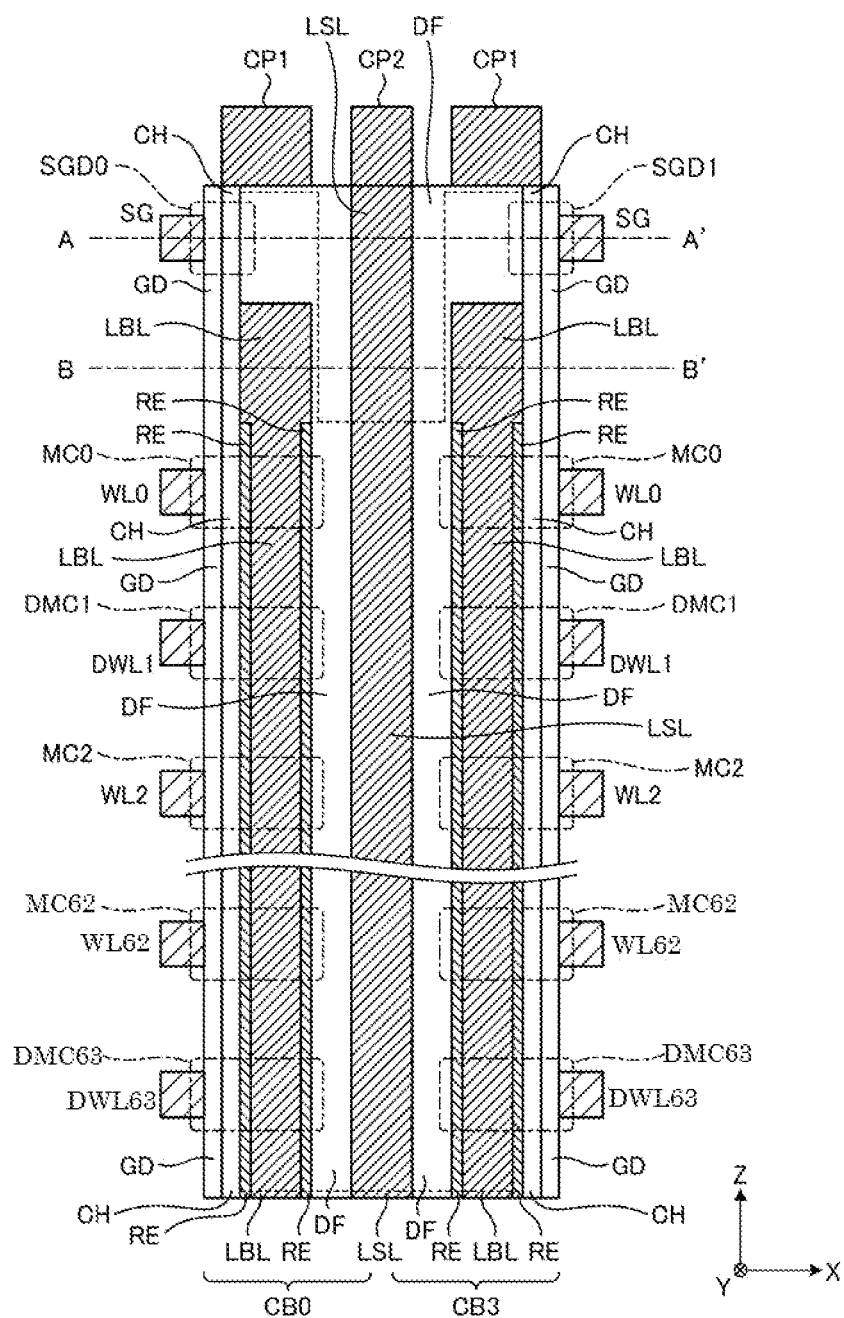
FIG. 15A shows the cell block of the variable resistance non-volatile memory according to the first embodiment, and an explanatory view of an example in which dummy word lines are arranged in a cross-sectional view taken along the XZ plane.
Figure 15B:
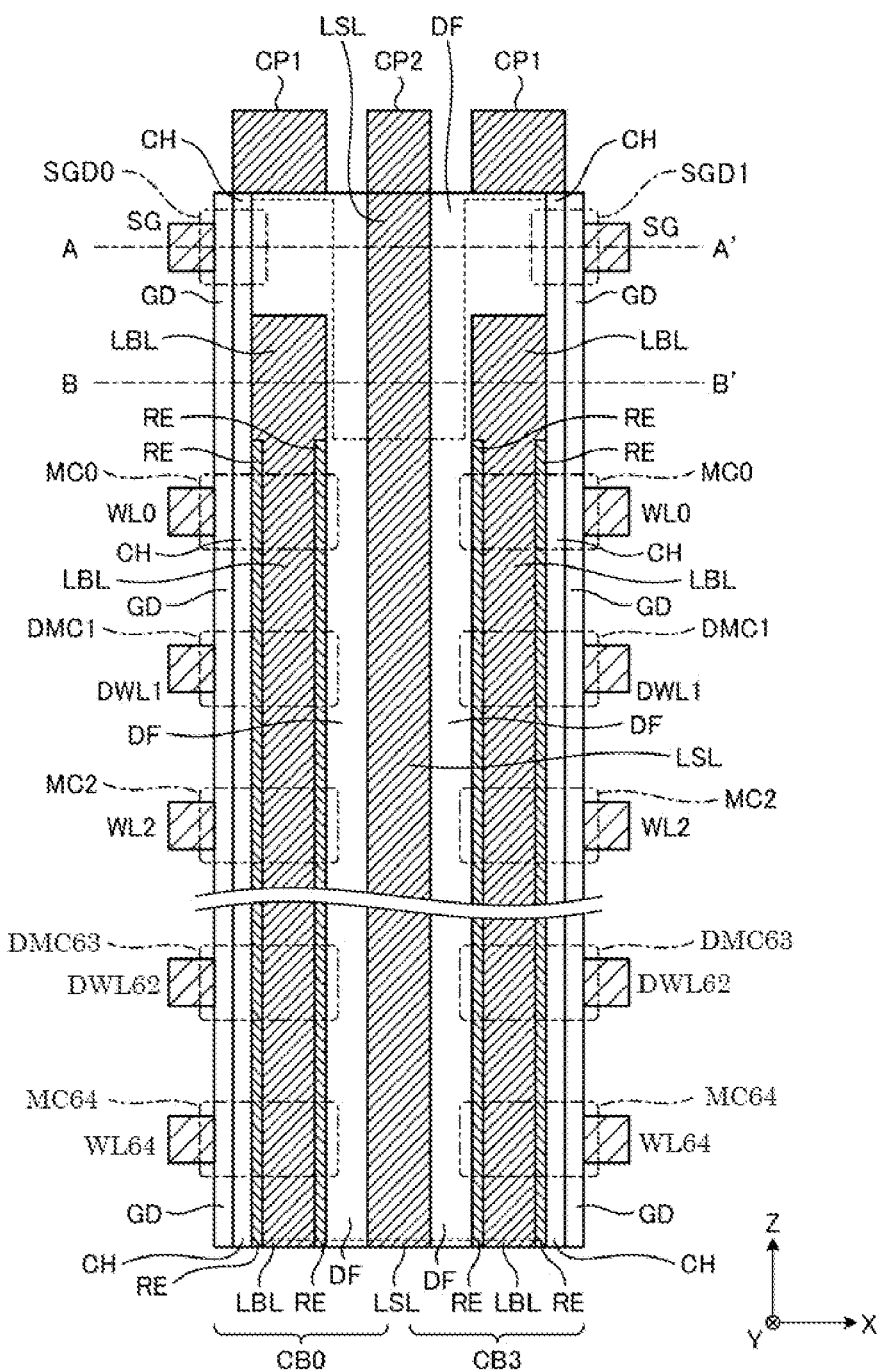
FIG. 15B shows another example of arrangement of word lines and dummy word lines.

FIG. 15A shows the cell block of the variable resistance non-volatile memory according to the first embodiment, and an explanatory view of an example in which dummy word lines DWL are disposed in a cross-sectional view taken along the XZ plane (FIG. 5). Further in FIG. 15A, the heat barrier film HB1 and the heat barrier film HB2 are omitted. In FIG. 15A, the word line WL and the dummy word line DWL are alternately arranged vertically. Here, the dummy word line DWL is an electrode line that inhibits a leak current between memory cells arranged vertically adjacent to each other in the Z direction, and may be referred to as a wraparound voltage inhibition electrode line, or simply an inhibition electrode line. The word line WL and the dummy word line DWL formed by the conductive film are stacked such as, for example, the word line WL0, a dummy word line DWL1, the word line WL2, a dummy word line DWL3, . . . , a word line WL62, and a dummy word line DWL63. Corresponding to these, the memory cell MC0, a dummy cell DMC1, the memory cell MC2, . . . , a memory cell MC62, and a dummy cell DMC63 are formed. Other configurations are the same as in FIG. 5. An arrangement of word lines and dummy word lines are not limited to an example of FIG. 15A. The word lines and dummy word lines may be arranged as shown in FIG. 15B. In the other words, an odd number (for example, 65) of conductive films may be stacked, and alternately designated as the word lines and the dummy word lines such that the uppermost conductive film and the lowermost conductive film function as the word line (for example, the word lines WL0 and WL64).

In the dummy word line DWL, as shown in FIG. 11, the low level $V_{L6}$ is applied in the timing period t0 to t1, the low level $V_{L7}$ ($V_{L7}<V_{L6}$) is applied in the timing period t1 to t3, and the low level $V_{L6}$ is applied in the timing period t3 and on. That is, the voltage of the same level $V_{L6}$ ($V_{L6}=V_{L3}$) as that of the non-selected word line WL, or the voltage of the level $V_{L7}$ ($V_{L7}<V_{L6}$) lower than that of the non-selected word line WL is applied to the dummy word line DWL, and the upper and lower dummy cells reliably cut off the leak current.

Figure 16:
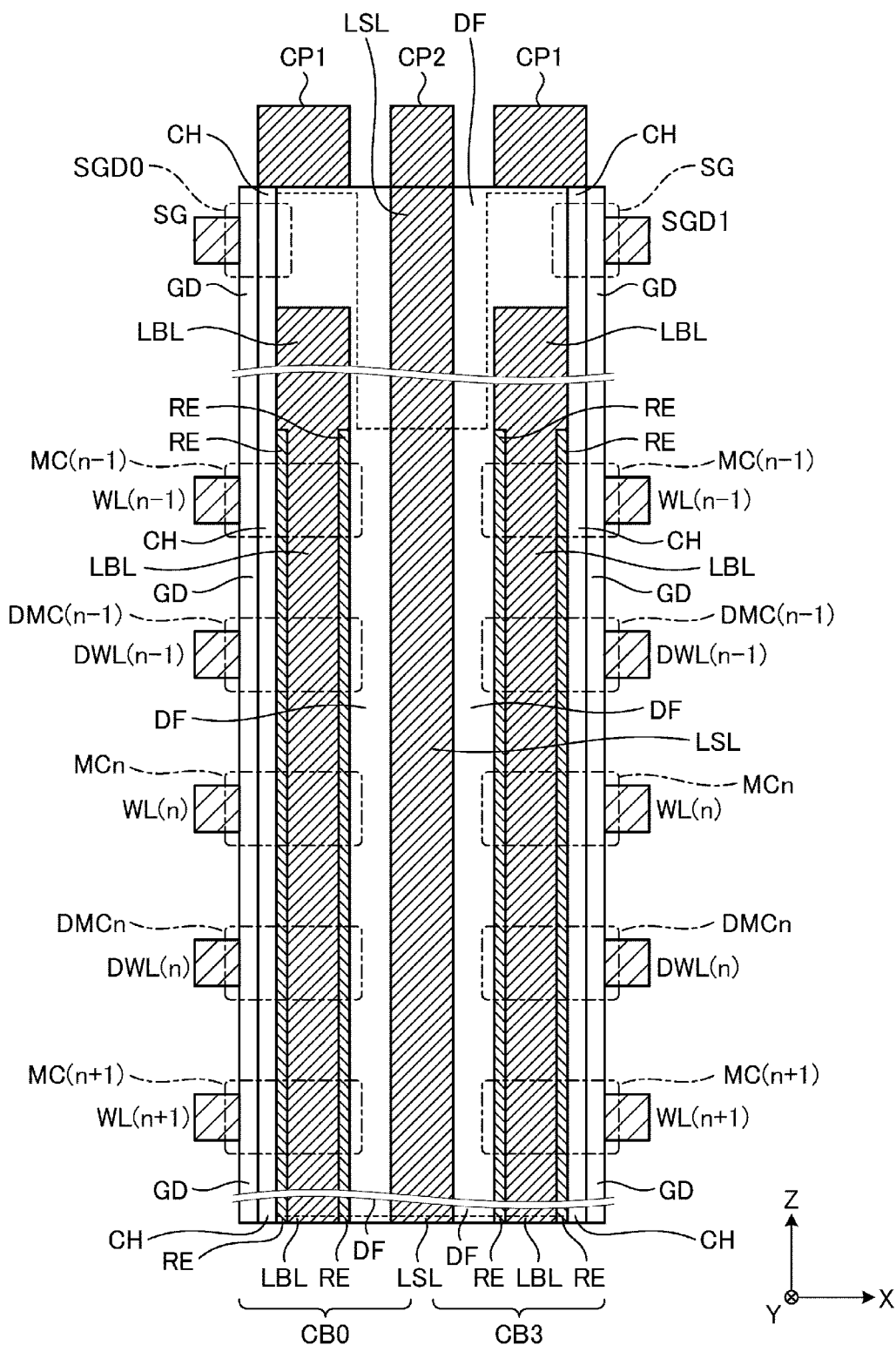
FIG. 16 is a cross-sectional view taken along the XZ plane of the cell block of the variable resistance non-volatile memory according to the first embodiment, and is an enlarged view in the vicinity of the dummy word line.

FIG. 16 is a cross-sectional view taken along the XZ plane of the cell block of the variable resistance non-volatile memory according to the first embodiment, and is an enlarged view in the vicinity of the dummy word line DWL. Further in FIG. 16, the heat barrier film HB1 and the heat barrier film HB2 are omitted. In FIG. 16, stacking is done as " . . . , the word line WL(n−1), the dummy word line DWL(n−1), the word line WL(n), the dummy word line DWL(n), the word line WL(n+1), . . . ". Further, corresponding to these, " . . . , the memory cell MC(n−1), the dummy cell DMC(n−1), the memory cell MC(n), the dummy cell DMC(n), the memory cell MC(n+1), . . . " are formed.

Figure 17A:
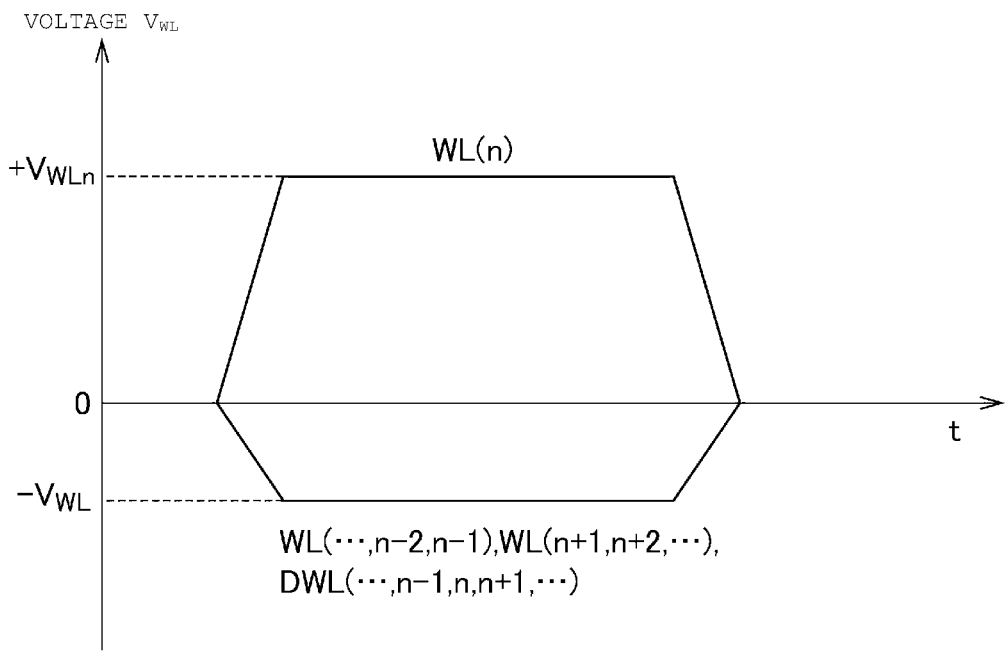
FIG. 17A is an example of an operation waveform of the variable resistance non-volatile memory according to the first embodiment.

FIG. 17A is an example of an operation waveform. In FIG. 17, with respect to a voltage $+V_{WLn}$ of the selected word line WL(n), the voltage of the dummy word line DWL( . . . , n−1, n, n+1, . . . ) and the voltage of the non-selected word lines WL( . . . , n−2, n−1) and WL(n+1, n+2, . . . ) are set to the voltage of the same value $-V_{WL}$, so that the upper and lower dummy cells reliably cut off the leakage current.

Figure 17B:
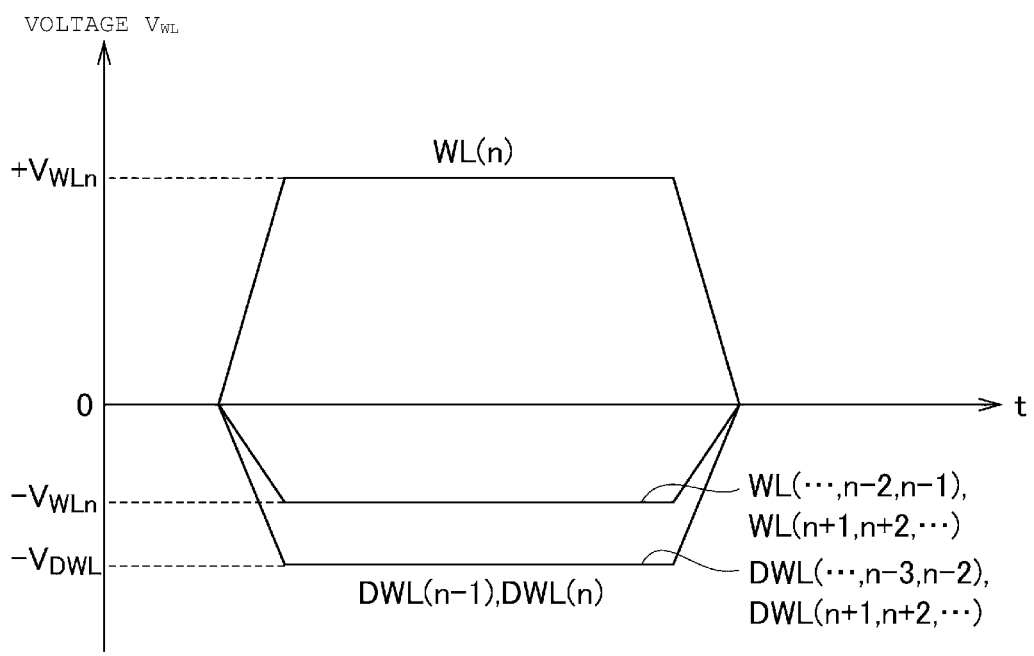
FIG. 17B is another example of an operation waveform of the variable resistance non-volatile memory according to the first embodiment.

Further, FIG. 17B is another example of an operation waveform. In FIG. 17B, with respect to the voltage $+V_{WLn}$ of the selected word line WL(n), the voltage of the non-selected word lines WL( . . . , n−2, n−1) and WL(n+1, n+2, . . . ) is set to $-V_{WLn}$, and the voltage of the dummy word lines DWL( . . . , n−1, n, n+1, . . . ) is set to $-V_{DWL}$, so that the upper and lower dummy cells more reliably cut off the leak current.

Here, for example, the voltage applied to the non-selected word line may be 0 V. However, the voltage may be −3 V, as long as the voltage can reliably cut off the transistor coupled to the non-selected word line. As for the voltage applied to the dummy word line DWL, the voltage suffices as long as the transistor coupled to the dummy word line DWL can be reliably cut off. When the voltage is the same as the voltage applied to the non-selected word line, the operation becomes easier to control. On the other hand, when the voltage is made lower than the voltage applied to the non-selected word line, the cutoff can be made more reliably.

The variable resistance non-volatile memory according to the first embodiment includes the local bit line LBL extending in the Z direction orthogonal to the semiconductor substrate 21, the local source line LSL that is adjacent in the X direction orthogonal to the Z direction with the insulating film DF interposed and extends in the Z direction, the variable resistance film RE extending in the Z direction and in contact with the local bit line LBL, the semiconductor film CH that extends in the Z direction and is in contact with the variable resistance film RE and in contact with the insulating film DF and the local source line LSL, the gate insulator film GD extending in the Z direction and in contact with the semiconductor film CH, the first memory cell MC1 extending in the X direction and including a first voltage application electrode WL in contact with the gate insulator film GD, and a second memory cell DMC provided at a position different from a position of the first voltage application electrode WL in the Z direction, extending in the X direction, and including a second voltage application electrode DWL in contact with the gate insulator film GD.

When the read operation is performed on the first memory cell MC1, a first voltage (for example, 7 V) is applied to a first voltage application electrode (selected word line WL), a second voltage (for example, 0 V) lower than the first voltage (for example, 7 V) is applied to a second voltage application electrode (DWL), and the read operation on the second memory cell DMC1 is not performed.

On the other hand, in the variable resistance non-volatile memory according to the first embodiment, since the dummy word line DWL is provided, a portion of the dummy cell DMC cannot be used for storage, and the capacity of the original variable resistance non-volatile memory is reduced. Further, the number of the dummy word lines DWL is not limited to one. A plurality of lines may be disposed consecutively. Further, the position where the dummy word line DWL is disposed may be between the select gate line SG and the word line WL0. Alternatively, the position where the dummy word line DWL is disposed may be between the word line WL63 and the semiconductor substrate 21.

Modification Example

Figure 18A:
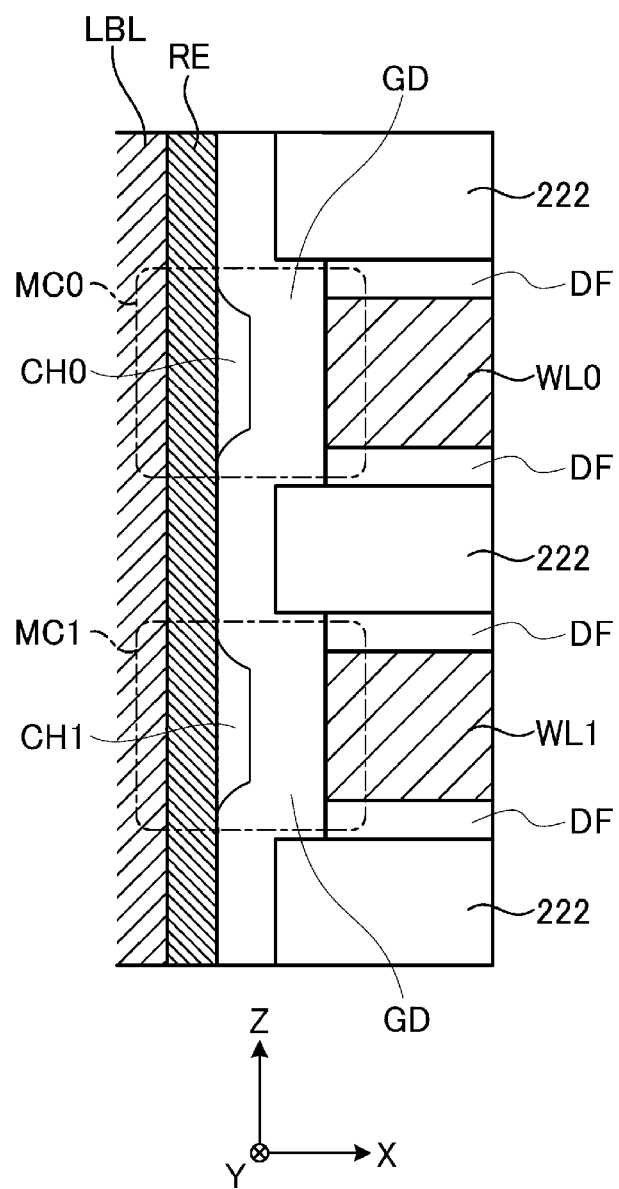
FIG. 18A shows a cell block of a variable resistance non-volatile memory according to a first modification example of the first embodiment, and is an enlarged cross-sectional view along the XZ plane.

FIG. 18A shows a cell block of a variable resistance non-volatile memory according to a modification example 1 of the first embodiment, and is an enlarged cross-sectional view along the XZ plane. In the variable resistance non-volatile memory according to the modification example 1 of the first embodiment, as shown in FIG. 18A, an example is shown in which the semiconductor film CH of the memory cells MC0 and MC1 arranged vertically in the Z direction is separated and the separated portions are respectively formed as semiconductor films CH0 and CH1. The same applies to the other memory cells MC2, . . . , and MC63. In the variable resistance non-volatile memory according to the modification example 1 of the first embodiment, the semiconductor films CH0, CH1, CH2, . . . , and CH63 of the memory cells MC0, MC1, MC2, and MC63 arranged vertically in the Z direction are separated, so that the leakage current between the memory cells in the vertical direction can be cut off.

Figure 18B:
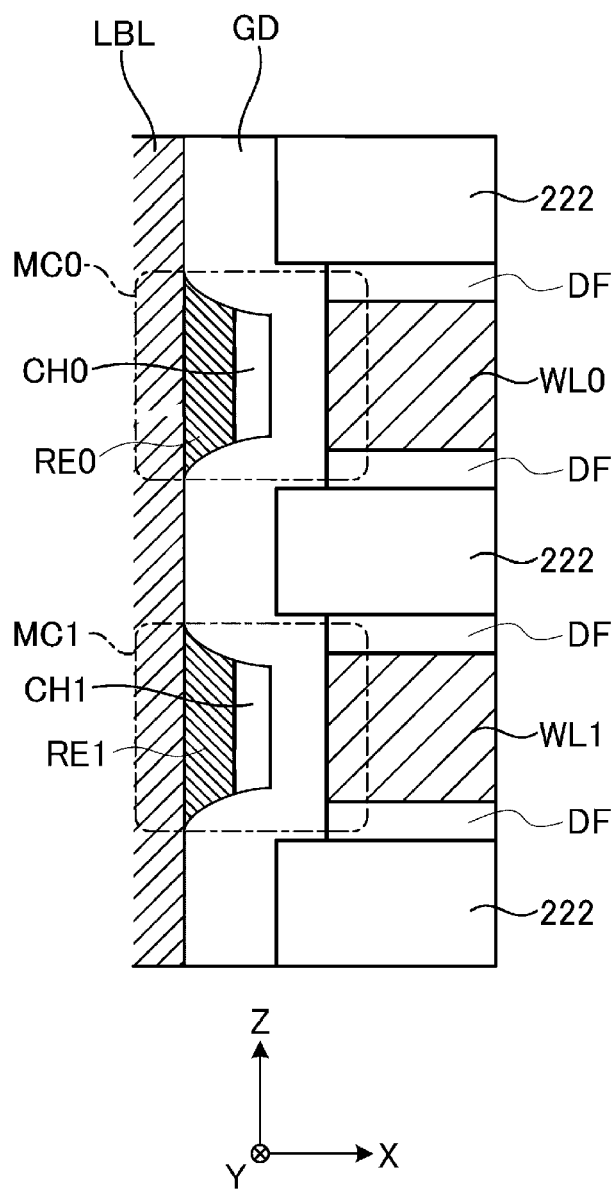
FIG. 18B shows a cell block of a variable resistance non-volatile memory according to a second modification example of the first embodiment, and is an enlarged cross-sectional view along the XZ plane.

FIG. 18B shows a cell block of a variable resistance non-volatile memory according to a modification example 2 of the first embodiment, and is an enlarged cross-sectional view along the XZ plane. In the variable resistance non-volatile memory according to the modification example 2 of the first embodiment, as shown in FIG. 18B, an example is shown in which the semiconductor films CH and the variable resistance films RE of the memory cells MC0 and MC1 arranged vertically in the Z direction are separated and the separated portions are respectively formed as semiconductor films CH0 and CH1 and variable resistance films RE0 and RE1. The same applies to the other memory cells MC2, . . . , and MC63. In the variable resistance non-volatile memory according to the modification example 2 of the first embodiment, the semiconductor films CH0, CH1, CH2, . . . , and CH63 and the variable resistance films RE0, RE1, RE2, . . . , RE63 of the memory cells MC0, MC1, MC2, and MC63 arranged vertically in the Z direction are separated, so that the leakage current between the memory cells in the vertical direction can be cut off. In the variable resistance non-volatile memory according to the modification example 1 of the first embodiment, since the semiconductor film CH is separated but the variable resistance film RE is common, the leakage current between the memory cells in the vertical direction via the variable resistance film RE is present in a small amount. On the other hand, in the variable resistance non-volatile memory according to the modification example 2 of the first embodiment, since the variable resistance film RE is also separated in addition to the semiconductor film CH, the leakage current between the memory cells in the vertical direction via the variable resistance film RE can also be cut off. On the other hand, in the structure shown in FIGS. 18A and 18B, the current conduction width corresponding to the channel width of the cell transistor MT is narrowed, and the cell current at the time of conduction is reduced.

Second Embodiment

Figure 19:
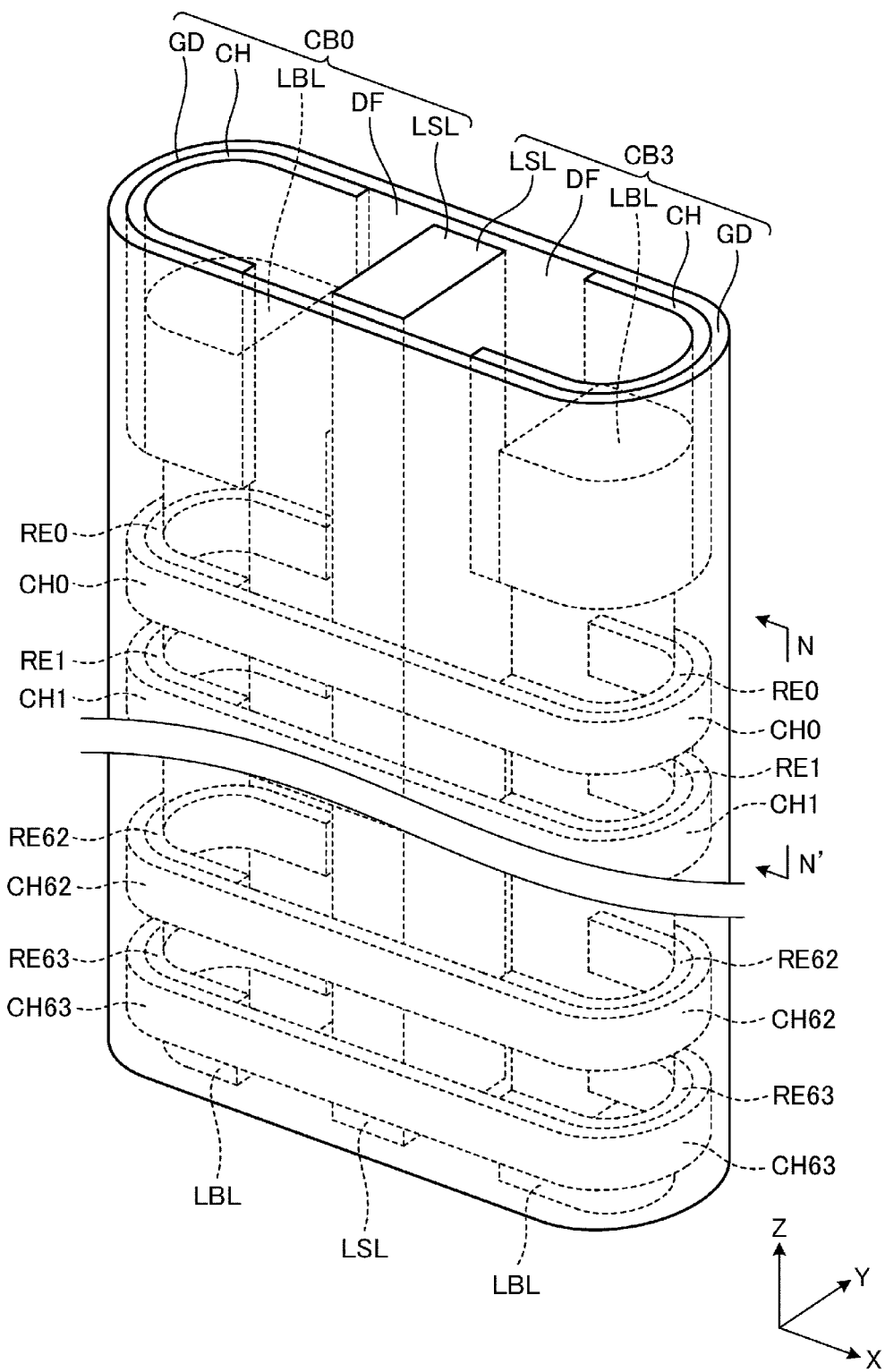
FIG. 19 is a perspective view of a cell block of a variable resistance non-volatile memory according to a second embodiment.

FIG. 19 is a perspective view of the cell blocks CB0 and CB3 of the variable resistance non-volatile memory according to the second embodiment. In FIG. 19, the heat barrier film and the heat generation film are omitted. The configuration including the heat barrier film and the heat generation film will be described later in FIGS. 20 to 22A and 22B.

In each cell block CB, the semiconductor film CH is divided into a plurality of semiconductor films CH0 to CH63 corresponding to the plurality of word lines WL0 to WL63. The plurality of semiconductor films CH0 to CH63 are stacked while being separated from each other in the Z direction. Each of the semiconductor films CH0 to CH63 has a horizontal 0-shaped shape with the X direction as the longitudinal direction in the XY plan view.

Further, in each cell block CB, the variable resistance film RE is divided into the plurality of variable resistance films RE0 to RE63 corresponding to the plurality of word lines WL0 to WL63. The plurality of variable resistance films RE0 to RE63 are stacked while being separated from each other in the Z direction. Each of the variable resistance films RE0 to RE63 has a horizontal U-shape in which the side facing the local source line LSL is open in the XY plan view.

Figure 20:
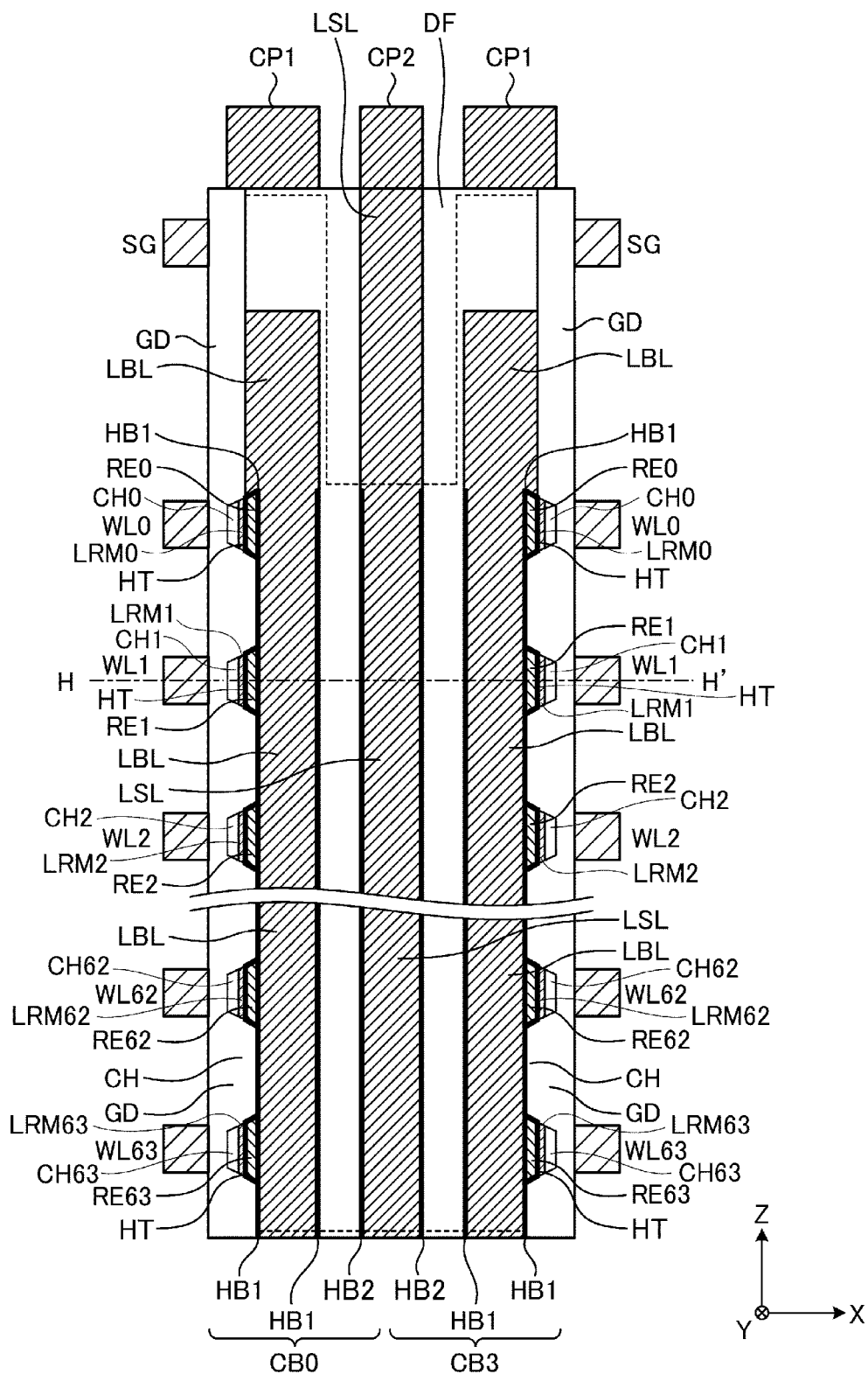
FIG. 20 is a cross-sectional view taken along the XZ plane of the cell block of the variable resistance non-volatile memory according to the second embodiment.
Figure 21:
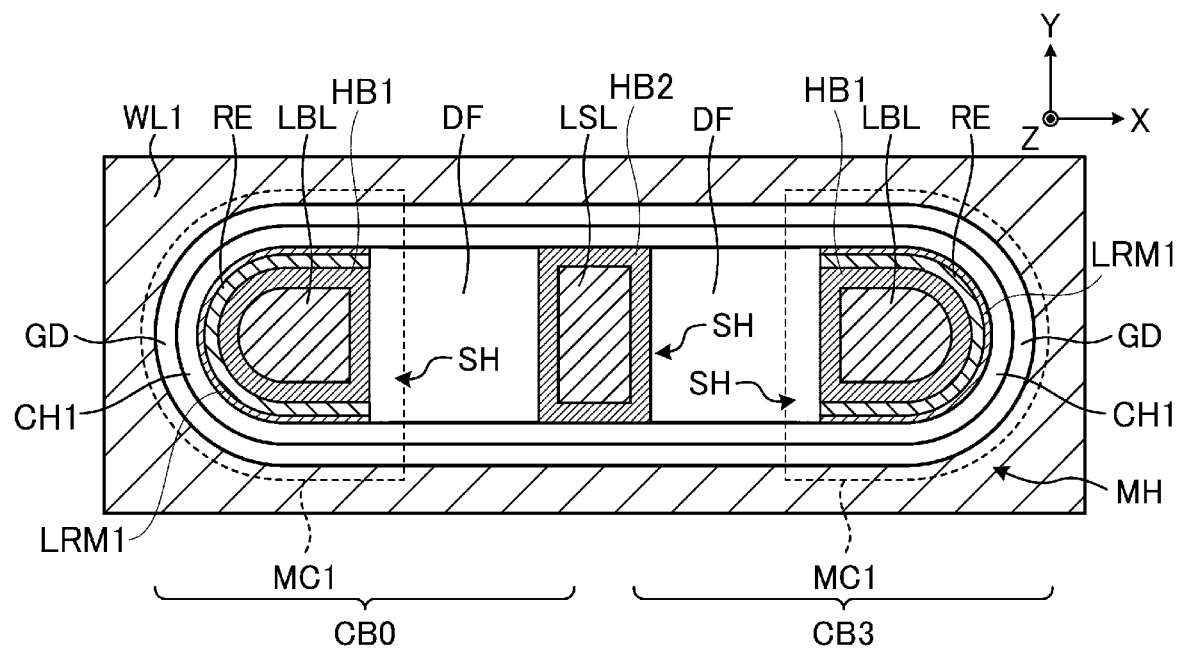
FIG. 21 shows the cell block of the variable resistance non-volatile memory according to the second embodiment, and is a cross-sectional view taken along line H-H' of FIG. 20.

FIG. 20 is a cross-sectional view taken along the XZ plane of the cell blocks CB0 and CB3 of the variable resistance non-volatile memory according to the second embodiment. FIG. 21 shows the cell blocks CB0 and CB3 of the variable resistance non-volatile memory according to the second embodiment, and is a cross-sectional view taken along line H-H' of FIG. 20. In FIG. 21, the heat generation film HT is omitted.

Figure 22A:
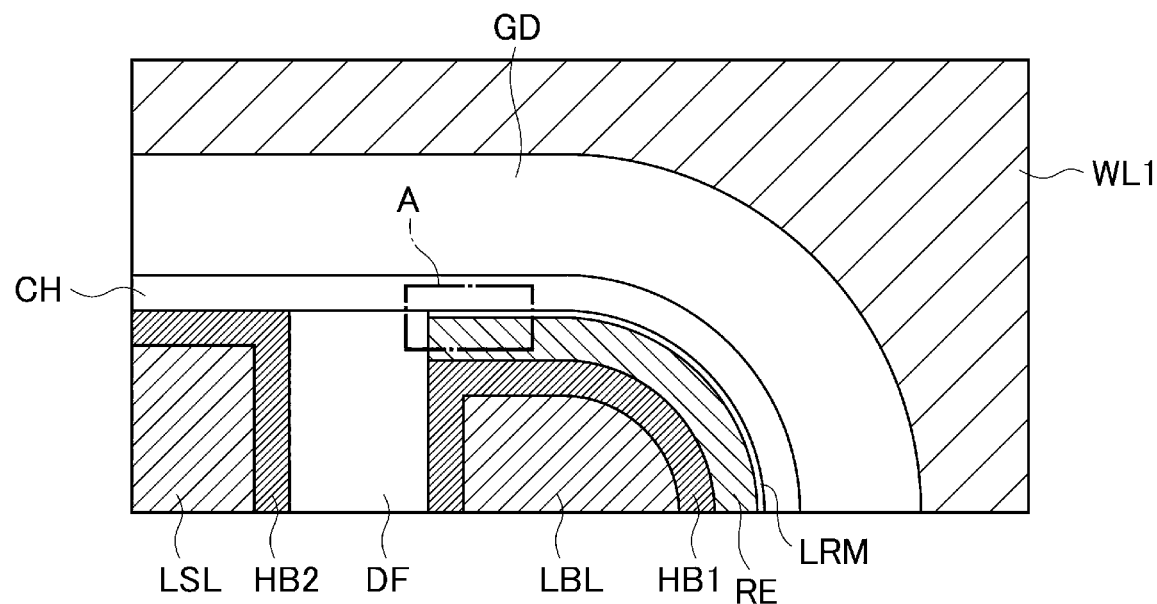
FIG. 22A shows the cell block of the variable resistance non-volatile memory according to the second embodiment, and is an enlarged cross-sectional view in the vicinity of the local source line and the local bit line.
Figure 22B:
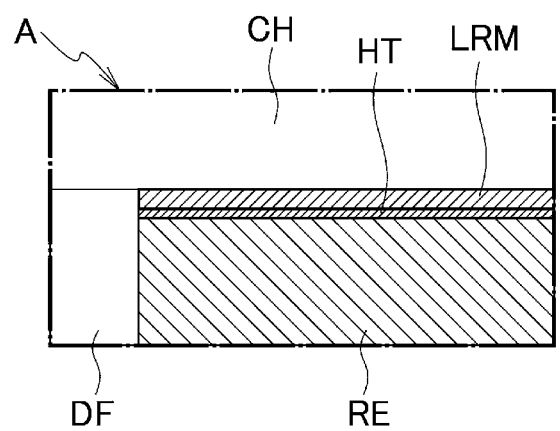
FIG. 22B is an enlarged view of an area portion A of FIG. 22A.

FIG. 22A shows the cell block of the variable resistance non-volatile memory according to the second embodiment, and is an enlarged cross-sectional view in the vicinity of the local source line LSL and the local bit line LBL. FIG. 22B is an enlarged view of an area portion A of FIG. 22A.

As shown in FIGS. 20 and 21, in the second embodiment, the first heat barrier film HB1 is provided between the variable resistance film RE and the local bit line LBL in each cell block, and the second heat barrier film HB2 is provided between the semiconductor film CH and the local source line LSL. For example, Joule heat generated in the variable resistance film RE due to the cell current when the variable resistance element RE of the selected memory cell MC is operated in Set and Reset is used. In the configuration in which the variable resistance film RE is in contact with the local bit line LBL, the heat generated by the variable resistance film RE leaks to the local bit line LBL and the semiconductor film CH, so that a relatively large cell current flows to raise the temperature up to a temperature at which Set and Reset operations are possible on the variable resistance film RE of the selected memory cell MC. In consideration of this, in the second embodiment, the cell block CB includes the first heat barrier film HB1 as shown in FIGS. 20 to 21, and it is possible to inhibit the leakage of the heat generated by the variable resistance film RE to the local bit line LBL. The heat barrier film HB1 can inhibit heat leakage from the variable resistance film RE while passing a current between the variable resistance film RE and the local bit line LBL. The heat generation film HT can inhibit heat leakage from the variable resistance film RE while passing a current between the variable resistance film RE and the semiconductor film CH. The heat barrier film HB2 can inhibit heat leakage from the variable resistance film RE while passing a current between the local source line LSL and the semiconductor film CH.

Further, in the variable resistance non-volatile memory according to the second embodiment, a low resistance layer LRM including a low resistance material is provided between the semiconductor film CH and the variable resistance film RE. In each cell block CB, the low resistance layer LRM is disposed between the variable resistance film RE and the semiconductor film CH. The low resistance layer LRM is divided into a plurality of low resistance layers LRM0 to LRM63 corresponding to the plurality of word lines WL0 to WL63. The plurality of low resistance layers LRM0 to LRM63 are stacked while being separated from each other in the Z direction. Each of the low resistance layers LRM0 to LRM63 has a horizontal U-shape with the side facing the local source line LSL open in the XY plan view. By interposing the low resistance layer LRM between the semiconductor film CH and the variable resistance film RE, the voltage of the variable resistance film RE can be made constant. Further, the voltage drop in the semiconductor film CH on the outer periphery of the variable resistance film RE can be reduced. In addition, the temperature of the entire variable resistance film RE can be raised. As the low resistance layer LRM including a low resistance material, for example, W, Ti, TiN, TaN, WSi, and the like can be applied.

The variable resistance non-volatile memory according to the second embodiment includes the first local bit line LBL extending in the Z direction orthogonal to the semiconductor substrate 21, the local source line LSL that is adjacent in the X direction orthogonal to the Z direction with the insulating film DF interposed and extends in the Z direction orthogonal to the semiconductor substrate 21, the variable resistance film RE extending in the Z direction and in contact with the first local bit line LBL, the semiconductor film CH that extends in the Z direction and is in contact with the variable resistance film RE and in contact with the insulating film DF and the local source line LSL, the low resistance layer LRM disposed between the semiconductor film CH and the variable resistance film RE and having a lower resistance value than the variable resistance film RE, the gate insulator film GD extending in the Z direction and in contact with the semiconductor film CH, and the memory cell MC extending in the X direction and including the first voltage application electrode WL in contact with the gate insulator film GD.

Further, as shown in FIGS. 20 and 22B, it is desirable that the variable resistance non-volatile memory according to the second embodiment includes a third heat barrier film HT between the low resistance layer LRM and the variable resistance film RE. Further, the third heat barrier film HT is in contact with the variable resistance film RE. The reason why the third heat barrier film HT is disposed between the low resistance layer LRM and the variable resistance film RE is that it is desirable that the variable resistance film RE retains heat. That is, since heat is dissipated when the low resistance layer LRM having a low resistivity such as W is brought into direct contact with the variable resistance film RE, it is desirable that the third heat barrier film HT is disposed between the low resistance layer LRM and the variable resistance film RE. As the third heat barrier film HT, it is preferable to use one that functions as a heat generation film. For example, germanium containing indium as an impurity may be used as the material of the heat generation film HT. The resistance of germanium containing indium can be easily increased by adjusting the concentration of indium as an impurity and the conductive type (p-type or n-type). For example, it is desirable that by adjusting the impurity concentration of p-type indium to about $1 \times 10^{15}$ to $1 \times 10^{16}$ cm$^{-3}$, the specific resistance of the heat generation film HT is about 0.5 to 4 Ωcm. Further, as the material of the heat generation film HT, tellurium containing indium as an impurity may be used, or a group III-V compound may be used.

On the other hand, in the variable resistance non-volatile memory according to the second embodiment, it is desirable that the heat barrier film is not disposed between the low resistance layer LRM and the semiconductor film CH. The reason why the heat barrier film is not disposed between the low resistance layer LRM and the semiconductor film CH is to avoid an increase in the resistance of the semiconductor film CH due to the heat barrier film. That is, the current path can be made uniform by directly bringing the low resistance layer LRM having a low resistivity such as W in contact with the semiconductor film CH.

As described above, in the second embodiment, in each cell block CB, the heat barrier film HB1 is interposed between the variable resistance film RE and the local bit line LBL, and the heat generation film HT and the low resistance layer LRM are interposed between the variable resistance film RE and the semiconductor film CH. As a result, the voltage difference between the variable resistance film RE and the semiconductor film CH can be made constant, and the heat generation film HT can assist the heat generation when the variable resistance film RE generates heat. As a result, the heat generation efficiency in the selected memory cell MC can be improved.

The heat generation film HT may be disposed between the variable resistance film RE and the local bit line LBL instead of between the variable resistance film RE and the semiconductor film CH. For example, in the configuration of each cell block CB shown in FIG. 21, by replacing the heat barrier film HB1 with the heat generation film HT, the heat generation film HT is disposed between the variable resistance film RE and the local bit line LBL. Even with this configuration, since the heat generation film HT functions as a heater in the vicinity of the variable resistance film RE, the heat generation of the variable resistance film RE can be assisted, and the heat generation efficiency in the selected memory cell MC can be improved.

When the heat generation film HT is interposed between the variable resistance film RE and the semiconductor film CH, the heat generation film HT has a substantially semi-cylindrical shape such that the outer side surface of the heat generation film HT faces the inner side surface of the semiconductor film CH, and that the inner side surface of the heat generation film HT faces the outer side surface of the variable resistance film RE. In an example of FIG. 22B, the variable resistance film RE includes a portion in contact with the semiconductor film CH via the heat generation film HT and the low resistance layer LRM and a portion in contact with the local bit line LBL.

Further, the heat barrier film HB2 may be interposed between the local source line LSL and the semiconductor film CH. The heat barrier film HB2 extends in the Z direction between the local source line LSL and the semiconductor film CH and penetrates the plurality of conductive films WL0 to WL63. The heat barrier film HB2 has a substantially square tube shape, the outer side surfaces on the +Y side and -Y side of the heat barrier film HB2 are in contact with the inner side surface of the semiconductor film CH, and the inner side surface of the heat barrier film HB2 is in contact with the outer side surface of the local source line LSL.

As the material of the heat barrier films HB1 and HB2, for example, a conductive material such as TiN, TaN, TiOx, C, and CN may be used, but by using a conductive material such as C—W and C—WN, the heat resistance can be further increased, and the heat generation efficiency can be improved from the viewpoint of inhibiting heat leakage to the side of the local bit line LBL.

For example, although the variable resistance film RE is formed of any of a phase change material, a magnetic material, and a metal oxide material, the variable resistance film RE operates at a high temperature or easily switches at a high temperature, so that by interposing the variable resistance film RE between the heat barrier film HB1 and the heat generation film HT having a high thermal resistance, heat escape due to heat generation can be inhibited and the temperature can be raised with a lower current. When the heat barrier film HB2 is also inserted around the central local source line LSL, it is possible to prevent the thermal energy of the variable resistance film RE from escaping to the local source line LSL via the semiconductor film CH. At the same time, the heat barrier film HB1 and the heat generation film HT make it possible to reduce the electrical contact resistance between the variable resistance film RE and another film.

Further, according to the heat barrier film HB1 and the heat generation film HT, it is possible to prevent the diffusion of various atoms into the variable resistance film RE or from the variable resistance film RE, and deterioration of data storage reliability also can be inhibited.

As described above, in the second embodiment, in each cell block CB, the heat barrier film HB1 is interposed between the variable resistance film RE and the local bit line LBL, and the heat generation film HT and the low resistance layer LRM are interposed between the variable resistance film RE and the semiconductor film CH. As a result, the magnitude of the cell current to raise the variable resistance element RE of the selected memory cell MC to a temperature at which Set and Reset operations are possible, can be reduced, and the power consumption of the variable resistance non-volatile memory can be reduced.

Figure 23:
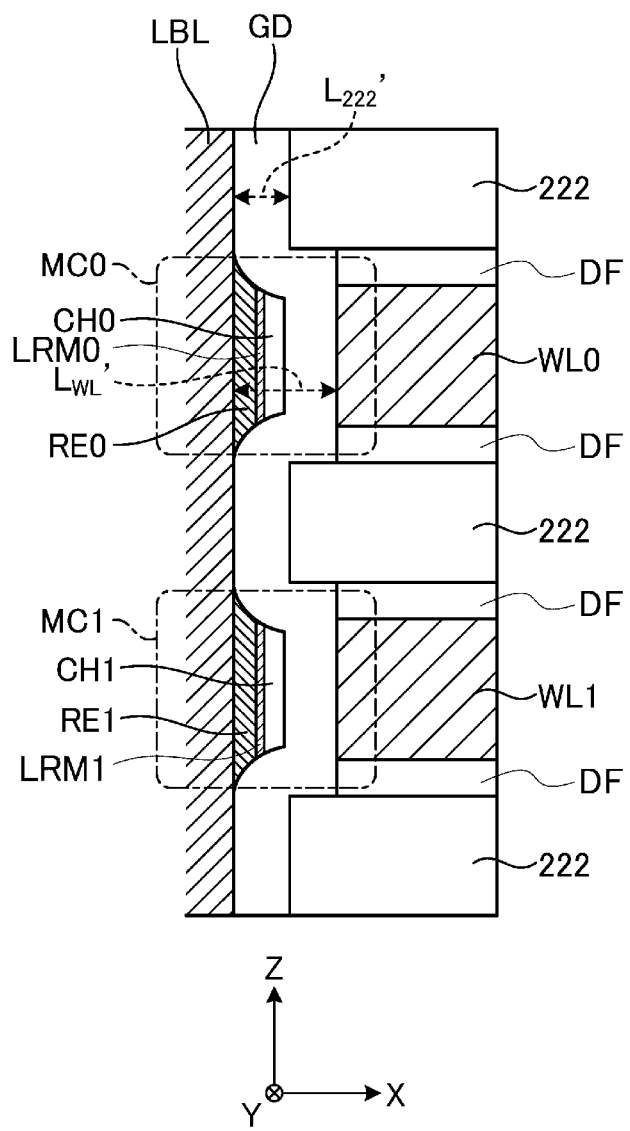
FIG. 23 is an enlarged cross-sectional view taken along the XZ plane of the cell block of the variable resistance non-volatile memory according to the second embodiment.

Further, FIG. 23 is an enlarged cross-sectional view taken along the XZ plane of the cell blocks CB0 and CB3 of the variable resistance non-volatile memory according to the second embodiment, and shows the XZ cross section of FIG. 19 cut by line N-N'. Further, in FIG. 23, the heat barrier film HB1 and the heat generation film HT are omitted.

In the configuration shown in FIG. 23, a distance $L_{WL}'$ in the XY direction from the local bit line LBL to the end face of each word line WL is farther than a distance $L_{222}'$ in the XY direction from the local bit line LBL to the end face of the insulating layer 222. As a result, the plurality of semiconductor films CH0 to CH63 are reliably divided in the Z direction. For example, the area to reset the variable resistance film RE is set to an area wider than the semiconductor film CH in the Z direction. As a result, since the current paths between the memory cells adjacent to each other in the Z direction can be electrically separated, leakage via the semiconductor film CH can be inhibited. Further, since the semiconductor film having a relatively high thermal conductivity is separated between the memory cells MC adjacent to each other in the Z direction, the thermal disturbance between the memory cells MC adjacent to each other in the Z direction can be reduced. Further, the low resistance layers LRM0 to LRM63 can uniformly raise the temperature of the variable resistance films RE0 to RE63, and the variation in the cell current conducting to the memory cell can be inhibited.

Further, the plurality of variable resistance films RE0 to RE63 are divided in the Z direction. As a result, since the current paths between the memory cells adjacent to each other in the Z direction can be electrically separated, leakage via the variable resistance film can be inhibited. Further, since the variable resistance film is separated between the memory cells MC adjacent to each other in the Z direction, the thermal distortion between the memory cells MC adjacent to each other in the Z direction can be further reduced.

The low resistance layers LRM0 to LRM63 function to increase the on-current of the cell transistor MT of each memory cell MC. In order to further increase the on-current of the cell transistor MT of each memory cell MC, the gate insulator film GD may be formed of a high-K insulator such as hafnium oxide that is a material having a higher relative permittivity K than silicon dioxide.

As described above, in the second embodiment, in each cell block CB, the plurality of semiconductor films CH0 to CH63 are divided in the Z direction corresponding to the plurality of word lines WL0 to WL63. As a result, since the semiconductor films CH0 to CH63 of each memory cell MC can be electrically separated in the Z direction, the disturbance current can be inhibited from flowing between the memory cells MC adjacent to each other in the Z direction, and it is possible to more stably perform the write operation and the read operation on the target memory cell MC while suppressing the unintentional effect on the non-target (for example, upper and/or lower) memory cell MC.

Further, in the second embodiment, in each cell block CB, the plurality of low resistance layers LRM0 to LRM63 are divided in the Z direction corresponding to the plurality of word lines WL0 to WL63. As a result, the temperature of the variable resistance films RE0 to RE63 can be uniformly raised, and the variation in the cell current flowing to the memory cell can be reduced. Further, the on-current of the cell transistor MT of each memory cell MC can be increased by using the low resistance layers LRM0 to LRM63.

Third Embodiment

Figure 24:
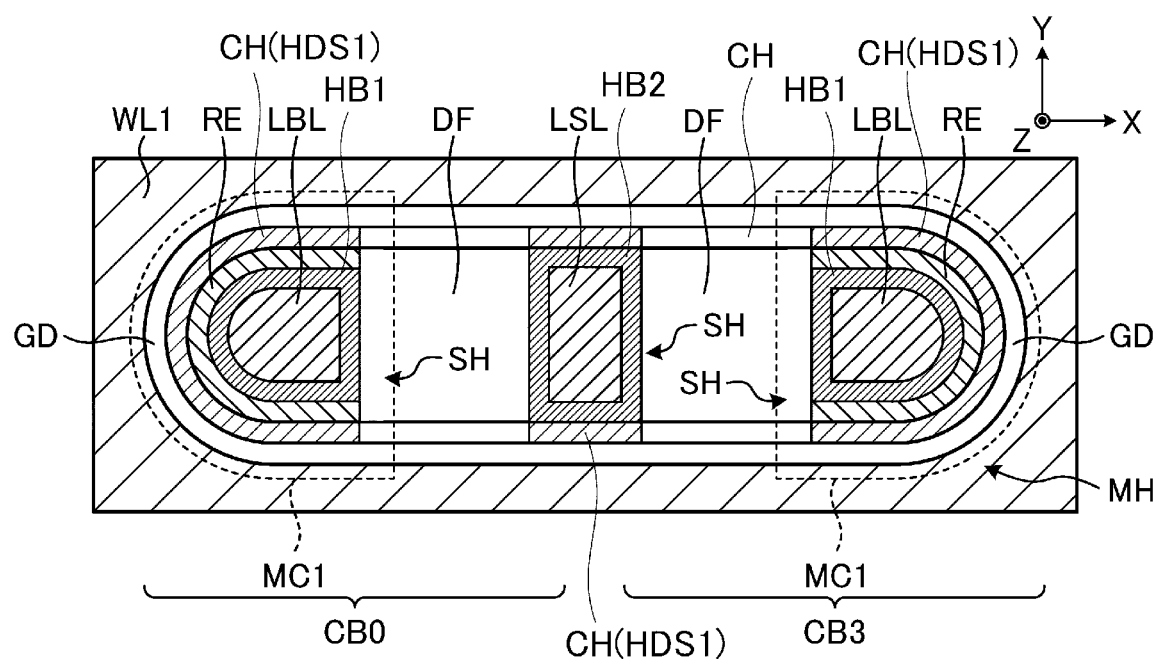
FIG. 24 shows a cell block of a variable resistance non-volatile memory according to a third embodiment, and is a cross-sectional view corresponding to FIG. 21 of the variable resistance non-volatile memory according to the second embodiment.
Figure 25:
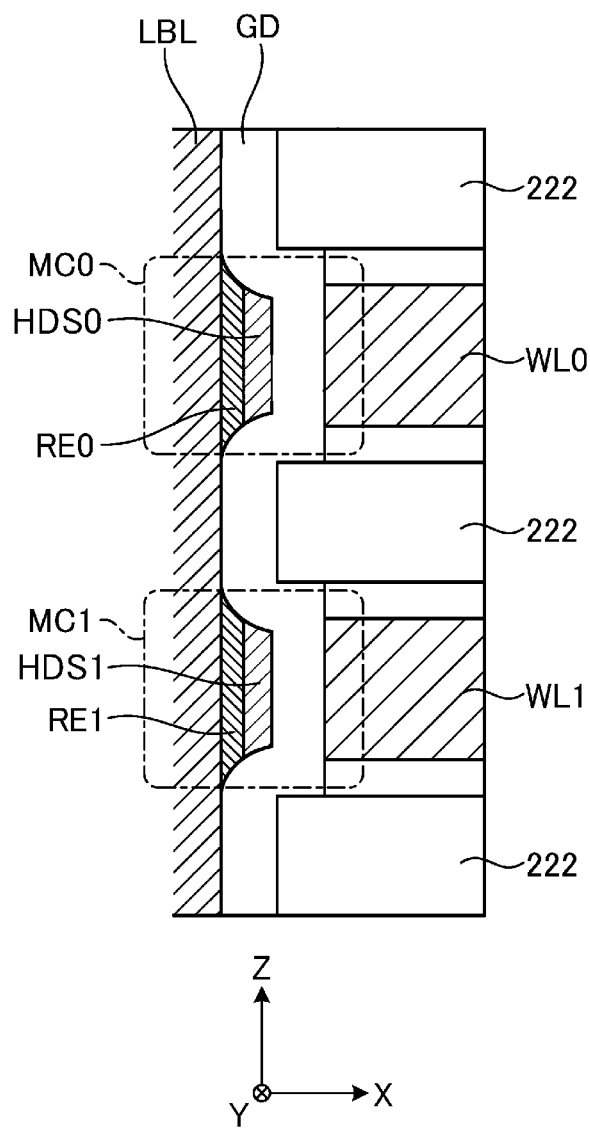
FIG. 25 is an enlarged cross-sectional view taken along the XZ plane of the cell block of the variable resistance non-volatile memory according to the third embodiment.

FIG. 24 shows a cell block of a variable resistance non-volatile memory according to a third embodiment, and is a cross-sectional view corresponding to FIG. 21 of the variable resistance non-volatile memory according to the second embodiment. FIG. 25 is an enlarged cross-sectional view taken along the XZ plane of the cell block of the variable resistance non-volatile memory according to the third embodiment. Further, in FIG. 25, the heat barrier film is omitted. The configuration including the heat barrier film is the same as in FIG. 20.

In each cell block CB, the semiconductor film is divided into the plurality of semiconductor films CH0 to CH63 corresponding to the plurality of word lines WL0 to WL63. The plurality of semiconductor films CH0 to CH63 are stacked while being separated from each other in the Z direction. Each of the semiconductor films CH0 to CH63 has a horizontal 0-shaped shape with the X direction as the longitudinal direction in the XY plan view.

Further, in each cell block CB, the variable resistance film is divided into the plurality of variable resistance films RE0 to RE63 corresponding to the plurality of word lines WL0 to WL63. The plurality of variable resistance films RE0 to RE63 are stacked while being separated from each other in the Z direction. Each of the variable resistance films RE0 to RE63 has a horizontal U-shape in which the side facing the local source line LSL is open in the XY plan view.

Further, in each cell block CB, a high-concentration doped layer is employed as the semiconductor film CH in contact with the variable resistance film RE. The high-concentration doped layer is divided into the plurality of semiconductor films CH0 (HDS0) to CH63 (HDS63) corresponding to the plurality of word lines WL0 to WL63. The plurality of semiconductor films CH0 (HDS0) to CH63 (HDS63) are stacked while being separated from each other in the Z direction. Each of the semiconductor films CH0 (HDS0) to CH63 (HDS63) has a horizontal U-shape in which the side facing the local source line LSL is open in the XY plan view.

Further, in each cell block CB, a high-concentration doped layer is also disposed on the semiconductor film CH in contact with the heat barrier film HB2 covering the local source line LSL. The high-concentration doped layer is divided into the plurality of semiconductor films CH0 (HDS0) to CH63 (HDS63) corresponding to the plurality of word lines WL0 to WL63. The plurality of semiconductor films CH0 (HDS0) to CH63 (HDS63) are stacked while being separated from each other in the Z direction.

The variable resistance non-volatile memory according to the third embodiment includes the local bit line LBL extending in the Z direction orthogonal to the semiconductor substrate 21, the local source line LSL that is adjacent in the X direction orthogonal to the Z direction with the insulating film DF interposed and extends in the Z direction, the variable resistance film RE extending in the Z direction and in contact with the local bit line LBL, the semiconductor film CH that extends in the Z direction and is in contact with the variable resistance film RE and in contact with the insulating film DF and the local source line LSL, the gate insulator film GD extending in the Z direction and in contact with the semiconductor film CH, and the memory cell MC extending in the X direction and including the first voltage application electrode WL in contact with the gate insulator film GD, and the semiconductor film CH has a high impurity concentration.

Further, the impurity concentration of the semiconductor film CH is higher in the second portion of the semiconductor film CH (HDS1) in contact with the variable resistance film RE than in the first portion in contact with the insulating film DF.

Further, the impurity concentration of the semiconductor film CH is higher in the third portion of the semiconductor film CH (HDS1) in contact with the local source line LSL than in the first portion in contact with the insulating film DF.

In the variable resistance non-volatile memory according to the third embodiment, the voltage drop in the semiconductor film CH is reduced, and the voltage difference between the semiconductor film CH and the variable resistance film RE becomes substantially constant.

In the variable resistance non-volatile memory according to the third embodiment, the high-concentration-doped semiconductor film CH (HDS1) in which the impurity concentration of the semiconductor film CH is increased to a high level is disposed around the local bit line LBL, so that the same effect as the disposition of the low resistance layer LRM in the second embodiment can be obtained. That is, it is possible to reduce the voltage drop in the semiconductor film CH on the outer periphery of the variable resistance film RE.

As the doping impurity, As or P can be applied to the semiconductor film CH formed of polysilicon. The impurity concentration of commonly used polysilicon is about $1\times10^{18}$ to $1\times10^{19}$ cm$^{-3}$. On the other hand, the impurity concentration of the high-concentration-doped semiconductor film CH (HDS1) is about $1\times10^{21}$ cm$^{-3}$.

By increasing the impurity concentration of the semiconductor film CH to a high level in the outer peripheral portion of the local source line LSL, the voltage drop in the outer peripheral portion of the local source line LSL can be reduced. Similarly, by increasing the impurity concentration of the semiconductor film CH to a high level in the outer peripheral portion of the local bit line LBL, the voltage drop in the outer peripheral portion of the local bit line LBL can be reduced. The effect of reducing the voltage drop can also be accomplished by increasing the impurity concentration of the semiconductor film CH to a high level in either one of the outer peripheral portion of the local source line LSL and the outer peripheral portion of the local bit line LBL.

Here, the impurity concentration of the semiconductor film CH on the outer peripheral portion of the insulating film DF between the local bit line LBL and the local source line LSL should not be increased to a high level. The portion is substantially the portion that controls the selection and non-selection of the memory cell MC (the cell transistor MT), and when the portion has a high impurity concentration, the cell cannot be in the non-selection state and is always turned on.

In the variable resistance non-volatile memory according to the first to third embodiments, the variable resistance film RE of the memory cell MC is formed of a phase change material, a superlattice film material, a magnetic material, or a variable resistance material, the phase change material includes a chalcogenide-based material, the superlattice film material includes a stack structure of GeTe and SbTe, the magnetic material includes a tunnel film interposed between a free layer and a pin layer, and the variable resistance material includes at least one selected from the group consisting of NiO$_X$, WO$_X$, TaO$_X$, TiO$_X$, HfO$_X$, ZnO$_X$, TiON, Ag—GeSe, Cu—GeSe, FeO$_X$, GeO$_X$, and STO.

(I) In addition to the above-mentioned alloy type phase transition element (Ge$_2$Sb$_2$Te$_5$), the configuration may include any of (II) alternate stacking of GeTe and Sb$_2$Te$_3$ as an interfacial phase transition element, (III) alternate stacking of GeTe and BiSbTe as an interfacial phase transition element, (IV) alternate stacking of Ge, Sb, and Te or a chalcogenide material, (V) TiO$_X$, WO$_X$, HfO$_X$, TaO$_X$, and the like as a variable resistance film, and (VI) a CoFe alloy, a NiFe alloy, and the like as an MTJ element.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A variable resistance non-volatile memory comprising:
   a semiconductor substrate;
   a first electrode line extending in a first direction away from the semiconductor substrate;
   a second electrode line extending in the first direction parallel to the first electrode line;
   an insulating film between the first electrode line and the second electrode line;
   a first variable resistance film formed on an outer periphery of the first electrode line;
   a first low electrical resistance layer formed on an outer periphery of the first variable resistance film and having a lower electrical resistance than the first variable resistance film;
   a first semiconductor film in contact with an outer periphery of the first low electrical resistance layer and the insulating film, and formed on opposite surfaces of the second electrode line;
   a gate insulator film extending in the first direction and in contact with an outer periphery of the first semiconductor film; and
   a first voltage application electrode that extends in a second direction that crosses the first direction, and is in contact with an outer periphery of the gate insulator film at a same height above the semiconductor substrate as the first semiconductor film.

2. The variable resistance non-volatile memory according to claim 1, further comprising:
   a second variable resistance film formed on the outer periphery of the first electrode line;
   a second low electrical resistance layer formed on an outer periphery of the second variable resistance film and having a lower electrical resistance than the second variable resistance film;
   a second semiconductor film in contact with an outer periphery of the second low electrical resistance layer and the insulating film, and formed on the opposite surfaces of the second electrode line; and
   a second voltage application electrode that is stacked above the first voltage application electrode in the first direction, extends in the second direction, and is in contact with the outer periphery of the gate insulator film at a same height above the semiconductor substrate as the second semiconductor film.

3. The variable resistance non-volatile memory according to claim 2, wherein:
   the first and second variable resistance films are made of the same material and are physically separate from each other;
   the first and second low electrical resistance layers are made of the same material and are physically separate from each other; and
   the first and second semiconductor films are made of the same material and are physically separate from each other.

4. The variable resistance non-volatile memory according to claim 3, further comprising:
   a first barrier film disposed between the first variable resistance film and the first electrode line and between the second variable resistance film and the first electrode line; and a second barrier film disposed between the first semiconductor film and the second electrode line and between the second semiconductor film and the second electrode line.

5. The variable resistance non-volatile memory according to claim 4, wherein
the first and second low electrical resistance layers each include at least one material selected from the group consisting of W, Ti, TiN, TaN, and WSi.

6. The variable resistance non-volatile memory according to claim 4, wherein
the first barrier film and the second barrier film each include at least one material selected from the group consisting of TiN, TaN, TiO$_x$, C, CN, C—W, and C—WN.

7. The variable resistance non-volatile memory according to claim 2, further comprising:
a barrier film between the first low electrical resistance layer and the first variable resistance film and between the second low electrical resistance layer and the second variable resistance film.

8. The variable resistance non-volatile memory according to claim 7, wherein
the barrier film includes a heat generation film.

9. The variable resistance non-volatile memory according to claim 8, wherein
the heat generation film includes germanium, tellurium, or a group III-V compound including indium as an impurity.

10. The variable resistance non-volatile memory according to claim 1, wherein
the first variable resistance film is formed of a phase change material, a superlattice film material, a magnetic material, or a variable resistance material,
the phase change material includes a chalcogenide-based material,
the superlattice film material includes a stack structure of GeTe and SbTe,
the magnetic material includes a tunnel film interposed between a free layer and a pin layer, and
the first variable resistance material includes at least one material selected from the group consisting of NiO$_x$, WO$_x$, TaO$_x$, TiO$_x$, HfO$_x$, ZnO$_x$, TiON, Ag—GeSe, Cu—GeSe, FeO$_x$, GeO$_x$, and STO.

11. A variable resistance non-volatile memory comprising:
a semiconductor substrate;
a first electrode line extending in a first direction away from the semiconductor substrate;
a second electrode line extending in the first direction parallel to the first electrode line;
an insulating film between the first electrode line and the second electrode line;
a first variable resistance film formed on an outer periphery of the first electrode line;
a first semiconductor film in contact with an outer periphery of the first variable resistance film and the insulating film, and formed on opposite surfaces of the second electrode line;
a gate insulator film extending in the first direction and in contact with an outer periphery of the first semiconductor film; and
a first voltage application electrode that extends in a second direction that crosses the first direction, and is in contact with an outer periphery of the gate insulator film at a same height above the semiconductor substrate as the first semiconductor film, wherein
wherein the second semiconductor film is doped with impurities at a concentration of at about $1\times10^{21}$ cm$^{-3}$ or above.

12. The variable resistance non-volatile memory according to claim 11, further comprising:
a second variable resistance film formed on the outer periphery of the first electrode line;
a second semiconductor film in contact with an outer periphery of the second variable resistance film and the insulating film, and formed on the opposite surfaces of the second electrode line; and
a second voltage application electrode that is stacked above the first voltage application electrode in the first direction, extends in the second direction, and is in contact with the outer periphery of the gate insulator film at a same height above the semiconductor substrate as the second semiconductor film,
wherein the second semiconductor film is doped with impurities at a concentration of at about $1\times10^{21}$ cm$^{-3}$ or above.

13. The variable resistance non-volatile memory according to claim 12, wherein
the first and second variable resistance films are made of the same material and are physically separate from each other; and
the first and second semiconductor films are made of the same material and are physically separate from each other.

14. The variable resistance non-volatile memory according to claim 11, wherein
an impurity concentration of the first semiconductor film is lower in a first portion in contact with the insulating film than in a second portion in contact with the variable resistance film.

15. The variable resistance non-volatile memory according to claim 14, wherein
an impurity concentration of the first semiconductor film is higher in a third portion in contact with the second electrode line than in the first portion in contact with the insulating film.

16. The variable resistance non-volatile memory according to claim 11, wherein
the first variable resistance film is formed of a phase change material, a superlattice film material, a magnetic material, or a variable resistance material,
the phase change material includes a chalcogenide-based material,
the superlattice film material includes a stack structure of GeTe and SbTe,
the magnetic material includes a tunnel film interposed between a free layer and a pin layer, and
the variable resistance material includes at least one material selected from the group consisting of NiO$_x$, WO$_x$, TaO$_x$, TiO$_x$, HfO$_x$, ZnO$_x$, TiON, Ag—GeSe, Cu—GeSe, FeO$_x$, GeO$^x$, and STO.

* * * * *